(12) United States Patent
Chou et al.

(10) Patent No.: US 12,002,536 B2
(45) Date of Patent: Jun. 4, 2024

(54) SENSING MODULE, MEMORY DEVICE, AND SENSING METHOD APPLIED TO IDENTIFY UN-PROGRAMMED/PROGRAMMED STATE OF NON-VOLATILE MEMORY CELL

(71) Applicant: MACRONIX INTERNATIONAL CO., LTD., Hsinchu (TW)

(72) Inventors: Yun-Chen Chou, Hsinchu (TW); Tien-Yen Wang, Hsinchu (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 68 days.

(21) Appl. No.: 17/705,469

(22) Filed: Mar. 28, 2022

(65) Prior Publication Data
US 2023/0307014 A1 Sep. 28, 2023

(51) Int. Cl.
*G11C 7/08* (2006.01)
*G11C 7/06* (2006.01)
*G11C 17/14* (2006.01)

(52) U.S. Cl.
CPC .............. *G11C 7/08* (2013.01); *G11C 7/065* (2013.01); *G11C 17/14* (2013.01)

(58) Field of Classification Search
CPC ............ G11C 7/08; G11C 7/065; G11C 17/14
See application file for complete search history.

(56) References Cited

U.S. PATENT DOCUMENTS

| 11,276,476 B1 * | 3/2022 | Pan | G11C 17/16 |
| 11,295,825 B2 * | 4/2022 | Omid-Zohoor | H01L 28/00 |

* cited by examiner

*Primary Examiner* — Vanthu T Nguyen
(74) *Attorney, Agent, or Firm* — McClure, Qualey & Rodack, LLP

(57) ABSTRACT

A sensing module, a memory device, and a sensing method are provided to perform a read operation so that the un-programmed/programmed state of a memory cell is identified. The sensing module includes a sensing amplifier and a current sink, and both are electrically connected to the memory cell. The sensing amplifier generates a sensing current and identifies the un-programmed/programmed state of the memory cell accordingly. The current sink receives a reference current being equivalent to the summation of the sensing current and a cell current flowing through the memory cell. The reference current is constant, and the sensing current is changed with the cell current. The cell current is generated based on a high read voltage and a low read voltage applied to the memory cell. The sensing current is higher if the memory cell is un-programmed, and the sensing current is lower if the memory cell is programmed.

20 Claims, 13 Drawing Sheets

SENSING MODULE, MEMORY DEVICE, AND SENSING METHOD APPLIED TO IDENTIFY UN-PROGRAMMED/PROGRAMMED STATE OF NON-VOLATILE MEMORY CELL

TECHNICAL FIELD

The disclosure relates in general to a sensing module, a memory device, and a sensing method, and more particularly to a sensing module, a memory device, and a sensing method capable of identifying the un-programmed/programmed state of a non-volatile memory cell.

BACKGROUND

Non-volatile memories are widely used in electronic devices for data storage. One-time programmable (hereinafter, OTP) memory is a type of non-volatile memory (hereinafter, NVM). The OTP memory utilizes permanent MOS-gate-oxide breakdown as a programming scheme. An OTP memory cell records data through programming.

FIG. 1 is a schematic diagram showing an NMOS memory cell. The NMOS memory cell 1 includes a source terminal (S), a gate terminal (G), and a drain terminal (D). The source terminal (S) is electrically connected to a bit line BL, the gate terminal (G) is electrically connected to a word line WL, and the drain terminal (D) is floating FL.

Table 1 summarizes how voltages are applied to the NMOS memory cell 1 during different types of operation.

TABLE 1

| type of operation | voltage relationship |
| --- | --- |
| program (write) operation | WL > BL<br>for example, WL = 8 V and BL = 0 V |
| sense (read) operation | WL < BL<br>for example, WL = 0 V and BL = 1 V |

When the NMOS memory cell 1 is programmed, a programming voltage Vpgm is applied to the gate terminal (G), through the word line WL. As the programming voltage Vpgm is greater than a MOS-gate-oxide breakdown voltage Vob (that is, Vpgm>Vob), defects are generated at the gate oxide of the NMOS memory cell 1. For OTP memory cells, a conductive filament is caused by the voltage stress from the programming voltage Vpgm.

The data storage state of the NMOS memory cell 1 needs to be identified through a read operation. In an ideal case, the sensed result should be varied with the un-programmed or programmed state of the NMOS memory cell 1. However, the correctness of the sensed result is affected by the physical position of the conductive filament.

FIGS. 2, 3A, and 3B are cross-section views of the NMOS memory cell. The NMOS memory cell 1 has a P-type substrate 10, a source diffusion region 11, a drain diffusion region 13, and a gate oxide 15. FIG. 2 corresponds to an un-programmed NMOS memory cell and FIGS. 3A and 3B correspond to programmed NMOS memory cells whose conductive filaments are located at different positions.

During the read operation, the source diffusion region 11 receives a read voltage (for example, 1V) from the bit line BL, and the gate oxide 15 receives another read voltage (for example, 0V) from the word line WL. FIG. 2 shows that no cell current cell is generated during the read operation if the NMOS memory cell is un-programmed.

For GTP memory cells, a conductive filament is formed at the gate oxide after being programmed. However, the precise position at which the breakdown occurs cannot be predicted nor controlled. Please refer to FIGS. 3A, and 3B together. The horizontal position of the conductive filament 12a is relatively close to the source diffusion region 11 in FIG. 3A (with a distance d1), and the horizontal position of conductive filament 12b is relatively far from the source diffusion region 11 in FIG. 3B (with a distance d2). The distance d2 is longer than the distance d1.

In FIG. 3A, the cell current Icell1 flows through the source diffusion region 11, a relatively shorter conducting path in the P-type substrate 10, and the gate oxide 15. In FIG. 3B, the cell current Icell2 flows through the source diffusion region 11, a relatively longer conducting path in the P-type substrate 10 and the gate oxide 15.

In FIGS. 3A and 3B, the conductive filaments 12a, 12b can be considered as a gate resistor Rgate. The resistance values of the gate resistors Rgate in FIGS. 3A and 3B are equivalent because they are both across the section of the gate oxide 15. The relatively shorter conducting path in FIG. 3A can be considered as a path resistor Rpath1, and the relatively longer conducting path in FIG. 3B can be considered as a path resistor Rpath2. The resistances of the path resistors Rpath1, Rpath2 are related to the lengths of the conducting paths. Thus, the resistance value of the path resistor Rpath2 is much greater than that of the path resistor Rpath1, and the cell current Icell2 is much lower than the cell current Icell1. Table 2 summarizes the sensed results corresponding to FIGS. 2, 3A, and 3B.

TABLE 2

| | open state | conductive state | |
| --- | --- | --- | --- |
| | FIG. 2 | FIG. 3A | FIG. 3B |
| cell resistor Rcell | Rcell = ∞ | Rcell1 = Rgate + Rpath1 | Rcell2 = Rgate + Rpath2 |
| cell current Icell | Icell = 0 | Icell1 = (BL − WL)/Rcell1 | Icell2 = (BL − WL)/Rcell2 ≈ 0 |

Please compare Table 2 and FIGS. 2, 3A, and 3B together. Theoretically speaking, the un-programmed/programmed state of the NMOS memory cell 1 can be identified by the generation of the cell current Icell. The NMOS memory cell 1 should be identified as un-programmed (FIG. 2) if the cell current Icell is not generated, and the NMOS memory cell 1 should be identified as programmed (FIGS. 3A and 3B) if the cell current Icell1, Icell2 is generated. However, the cell current Icell2 in FIG. 3B is very difficult to detect because it is extremely small and close to 0.

In an ideal case, the sensed result of FIG. 2 should be different from the sensed results of FIGS. 3A and 3B, and the sensed results of FIGS. 3A and 3B should be the same. However, based on the conventional approach, the sensed results of FIGS. 2 and 3B are similar and, the sensed results of FIGS. 3A and 3B are different. Consequentially, the conventional read operation encounters difficulties in correctly identifying the un-programmed/programmed state of the memory cell.

As illustrated above, the position of the breakdown is randomly determined and uncontrollable, and the randomly generated breakdown position results in the variation of the cell current Icell. As the cell current Icell2 cannot be accurately acquired, the state of the memory cell cannot be correctly identified, and the consequent operation of the memory device having such a memory cell is erroneous.

SUMMARY

The disclosure is directed to a sensing module, a memory device, and a sensing method. The sensing module, the memory device, and the sensing method are utilized to identify the un-programmed/programmed state of the non-volatile memory cell.

According to one embodiment, a sensing module is provided. The sensing module performs a read operation to a memory cell. The sensing module includes a sensing amplifier and a current sink. The sensing amplifier is electrically connected to the memory cell. The sensing amplifier generates a sensing current and identifies a state of the memory cell based on the sensing current. The current sink is electrically connected to the memory cell and the sensing amplifier. The current sink generates a reference current being equivalent to a summation of the sensing current and a cell current flowing through the memory cell. The reference current is constant, and the sensing current is changed with the cell current. The cell current is generated based on a high read voltage and a low read voltage being applied to the memory cell. The sensing current is higher if the memory cell is un-programmed, and the sensing current is lower f the memory cell is programmed.

According to another embodiment, a memory device is provided. The memory device includes a memory circuit and a sensing module. The memory circuit includes M bit lines, N word lines, and M*N memory units. The M bit lines are arranged in parallel with a first direction, and the N word lines are arranged in parallel with a second direction. A selected memory unit among the M*N memory units is electrically connected to an m-th bit line among the M bit lines and an n-th word line among the N word lines. The sensing module is electrically connected to the M bit lines. The sensing module performs a read operation to the selected memory unit. The sensing module includes a sensing amplifier and a current sink. The sensing amplifier is electrically connected to the selected memory unit. The sensing amplifier generates a sensing current and identifies a state of the memory cell based on the sensing current. The current sink is electrically connected to the selected memory unit and the sensing amplifier. The current sink receives a reference current being equivalent to a summation of the sensing current and a cell current flowing through a memory cell in the selected memory unit. The reference current is constant, and the sensing current is changed with the cell current. The cell current is generated based on a high read voltage and a low read voltage being applied to the memory cell. The sensing current is higher if the memory cell is un-programmed, and the sensing current is lower if the memory cell is programmed.

According to an alternative embodiment, a sensing method applied to a sensing module is provided. The sensing module is configured to read a state of a memory cell. The sensing method includes the following steps. Firstly, a high read voltage and a low read voltage are applied to the memory cell so that a cell current flowing through the memory cell is generated. Then, a sensing current is generated. The sensing current is higher if the memory cell is un-programmed, and the sensing current is lower if the memory cell is programmed. Moreover, a reference current, being equivalent to a summation of the sensing current and the cell current, is received. The reference current is constant, and the sensing current is changed with the cell current. Then, the state of the memory cell is identified based on the sensing current.

Figure 1:
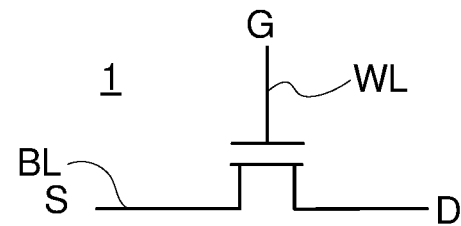
FIG. 1 (prior art) is a schematic diagram showing an NMOS memory cell.

In the following detailed description, for purposes of explanation, numerous specific details are set forth in order to provide a thorough understanding of the disclosed embodiments. However, it will be apparent that one or more embodiments may be practiced without these specific details. In other instances, well-known structures and devices are schematically shown in order to simplify the drawing.

DETAILED DESCRIPTION

Figure 4A:
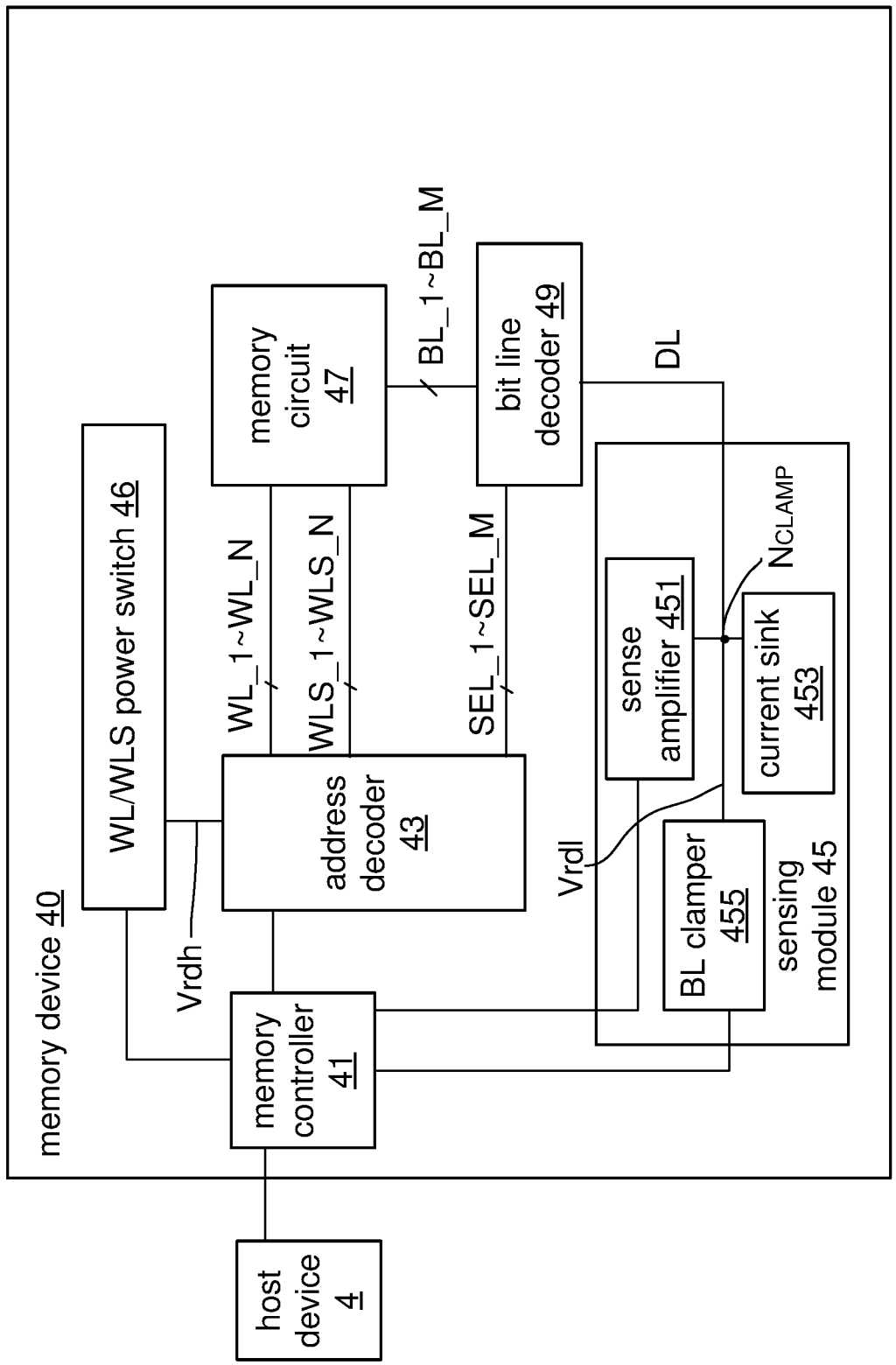
FIG. 4A is a block diagram schematically illustrating a memory device.

FIG. 4A is a block diagram schematically illustrating a memory device. A host device 4 and a memory device 40 are electrically connected together. The memory device 40 includes a memory controller 41, a word line (WL)/word line selection (WLS) power switch 46, an address decoder 43, a memory circuit 47, a bit line decoder 49, and a sensing module 45. The memory controller 41 performs a memory operation (for example, write operation, read operation, and so forth) in response to a command from the host device 4.

The memory controller 41 is electrically connected to the host device 4, the WL/WLS power switch 46, the address decoder 43, and the sensing module 45. After receiving the command from the host device 4, the memory controller 41 transmits a memory address of a selected memory cell to the address decoder 43. The location of the selected memory cell can be represented with the column address (m) and the row address (n) in a coordinate format, for example, (m, n).

The memory address is further decoded by the address decoder 43 to generate a column address (m) and a row address (n). The column address (m) corresponds to a column selection line SEL_m and a selected bit line BL_n, and the row address (n) corresponds to a selected word line WL_m.

The WL/WLS power switch 46 is electrically connected to the address decoder 43, and the address decoder 43 is electrically connected to the memory circuit 47 through word lines WL_1~WL_N and word selection lines WLS_1~WLS_N. After receiving the high read voltage Vrdh from the WL/WLS power switch 46, the address decoder 43 conducts the high read voltage Vrdh to the selected memory cell through the selected word line WL_m.

The bit line decoder 49 is electrically connected to the address decoder 43 through column selection lines SEL_1~SEL_M. The bit line decoder 49 is electrically connected to the memory circuit 47 through bit lines BL_1~BL_M. Moreover, the bit line decoder 49 is electrically connected to the sensing module 45 through a data line DL. The data line DL conducts a cell current Icell representing the un-programmed/programmed state of a selected memory cell to a clamp terminal $N_{CLAMP}$.

The sensing module 45 further includes a bit line (BL) clamper 455, a sense amplifier 451, and a current sink 453. The bit line (BL) clamper 455, the sense amplifier 451, and the current sink 453 are electrically connected to the clamp terminal $N_{CLAMP}$. The BL clamper 455 provides a low read voltage Vrdl to the clamp terminal $N_{CLAMP}$ so that the clamp terminal $N_{CLAMP}$ is maintained at the low read voltage Vrdl. The low read voltage Vrdl is slightly greater than but close to the ground voltage Gnd. The sense amplifier 451 senses the state of a selected memory cell, based on the cell current Icell. The current sink 453 receives a reference current Iref having a constant value, and the reference current Iref includes a sensing current Isen from the sensing amplifier 451 and the cell current Icell.

In the following embodiment, the memory circuit 47 is assumed to be composed of NMOS transistor for illustration purposes. Whereas the designs and types of the memory cells are not limited in practical applications.

Figure 4B:
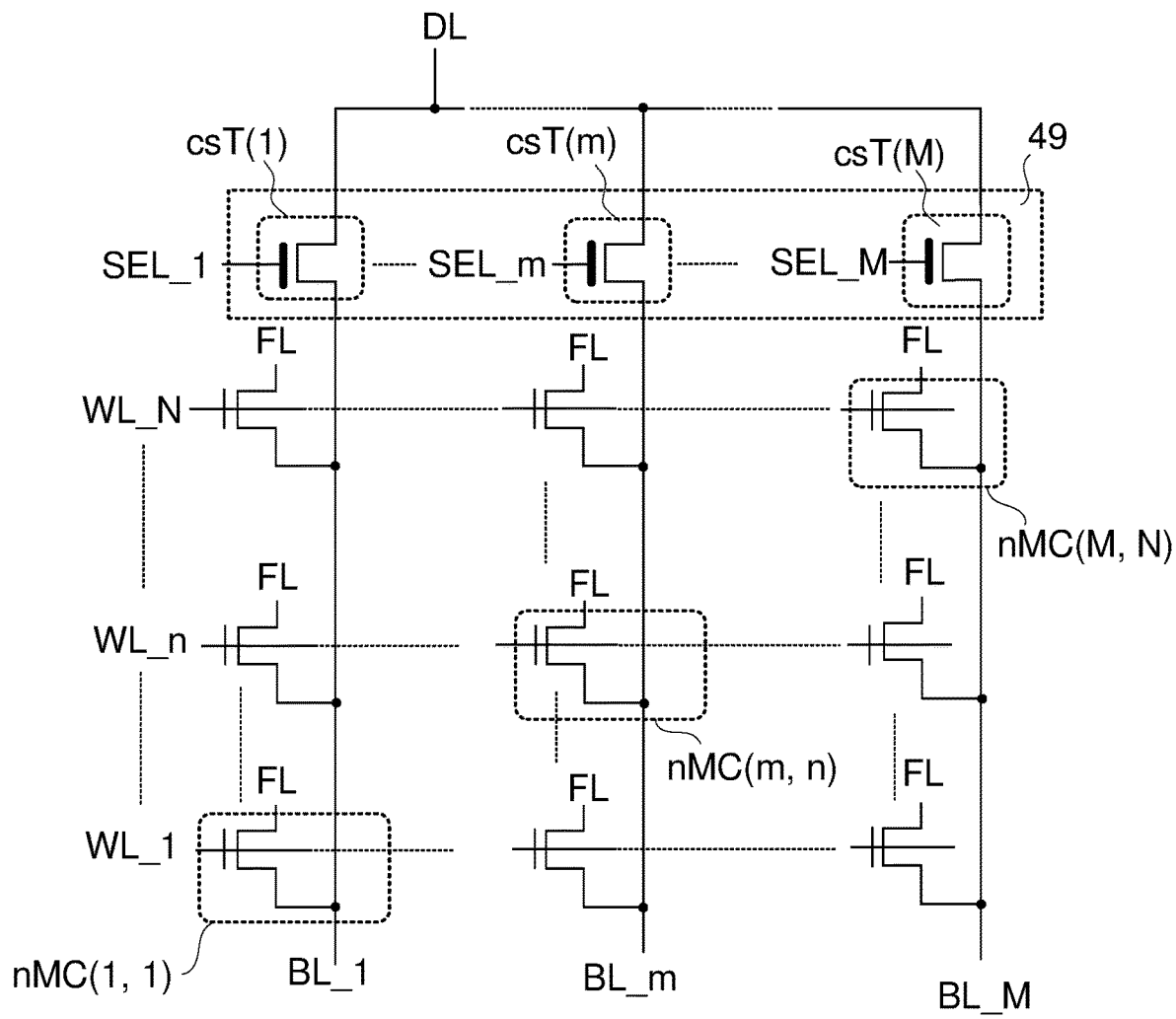
FIG. 4B is a schematic diagram illustrating a memory circuit in which NMOS memory cells nMC(1, 1)~nMC(M, N) are arranged in an array having M columns and N rows.

FIG. 4B is a schematic diagram illustrating a memory circuit in which NMOS memory cells are arranged in an array having M columns and N rows. The memory circuit includes M bit lines and N word lines. The M bit lines parallel to y-direction and N word lines are parallel to x-direction. In the memory circuit 47, the NMOS memory cells nMC(1, 1)~nMC(M, N) are arranged in a matrix having M columns and N rows. In the specification, the parameters m, n, M, N are positive integers. The parameter m is smaller than or equivalent to parameter M, and the parameter n is smaller than or equivalent to parameter N.

The bit line decoder 49 includes column selection transistors csT(1)~csT(M), used to control at which column the NMOS memory cell nMC(m, n) is located. The column selection transistors csT(1)~csT(M) are high voltage transistors. In FIG. 4B, the column selection transistors csT(1)~csT(M) are assumed to be NMOS transistors, but they can be other types of transistors. The drain terminals (D) of the column selection transistors csT(1)~csT(M) are jointly electrically connected to a data line DL, and the data line DL is electrically connected to the sense amplifier 451 and the current sink 453. When the memory controller 41 selects a specific memory cell, the data line DL reflects the voltage of the bit line corresponding to the specific memory cell, That is, DL=BL_m.

The drain terminals (D) of the M*N NMOS memory cells are floating FL. The gate terminals (G) of the memory cells arranged in the same row are electrically connected to the same word line, and the source terminals (S) of the memory cells arranged in the same column are electrically connected to the same bit line BL1~BL_M.

For the sake of illustration, the NMOS memory cell nMC(m, n) is used as an example only, and any of the NMOS memory cells nMC(1,1)~nMC(M, N) can be accessed in a similar manner. When the NMOS memory cell nMC(m, n) is selected for programming or sensing, the column selection signal SEL_m is set to a low voltage level to switch on the column selection transistor csT(m). Then, the data line DL and the bit line BL_m are conducted when the column selection transistor csT(m) is switched on.

As illustrated above, the conventional read operation of the memory cell might be incorrect due to the variant position of the conductive filament. Therefore, the specification focuses on how to correctly identify the un-programmed/programmed state of the NMOS memory cell nMC(m, n) during the read operation. Thus, the control of the column selection transistor csT(1)~csT(M) are not illustrated.

Figure 5:
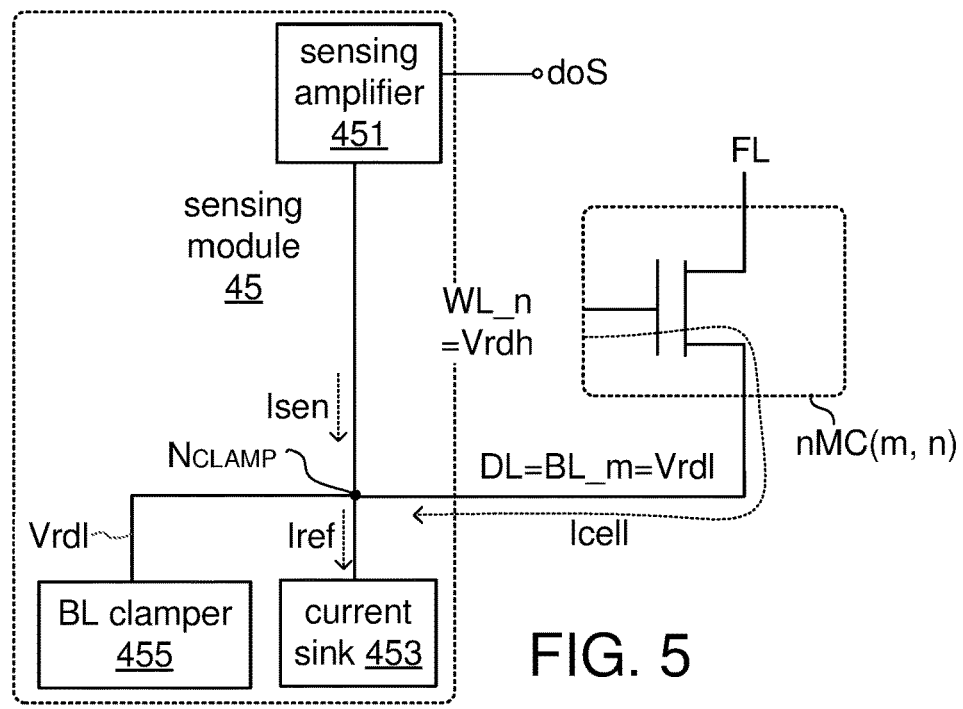
FIG. 5 is a schematic diagram illustrating that the sensing module is provided to read the NMOS memory cell nMC(m, n) according to an embodiment of the present disclosure.

FIG. 5 is a schematic diagram illustrating that the sensing module is provided to read the NMOS memory cell MC(m, n) according to an embodiment of the present disclosure. The sensing module 45 includes a BL clamper 455, a sensing amplifier 451, and a current sink 453. The BL clamper 455, the sensing amplifier 451, the current sink 453, and the NMOS memory cell nMC(m, n) are electrically connected together at the clamp terminal $N_{CLAMP}$.

According to the embodiment of the present disclosure, when the memory controller 41 selects to read the NMOS memory cell nMC(m, n), the word line WL_n receives a high read voltage Vrdh, and the bit line BL_m receives the low read voltage Vrdl through the data line DL. The high read voltage Vrdh is greater than the low read voltage Vrdl, and the high read voltage Vrdh and the low read voltage Vrdl are greater than the ground voltage Gnd. For example, Vrdh=2.5V and Vrdl=1V.

As shown in FIG. 5, a cell current Icell flow from the gate terminal (G) of the NMOS memory cell nMC(m, n) to the source terminal (S) of the NMOS memory cell nMC(m, n). A sensing current Isen flows from the sensing amplifier 451 to the clamp terminal $N_{CLAMP}$. The summation of the sensing current Isen and the cell current Icell is defined as a reference current Iref, and the reference current ref flows from the clamp terminal $N_{CLAMP}$ to the current sink 453. The sensing amplifier 451 transforms the cell current Isen to a data output signal doS, and the data output signal doS is further transmitted to the memory controller 41.

In practical applications, the circuit design of the sensing amplifier 451 and the current sink 453 are not limited. For example, FIG. 6 shows several exemplary implementations of the current sink 453.

Figure 6:
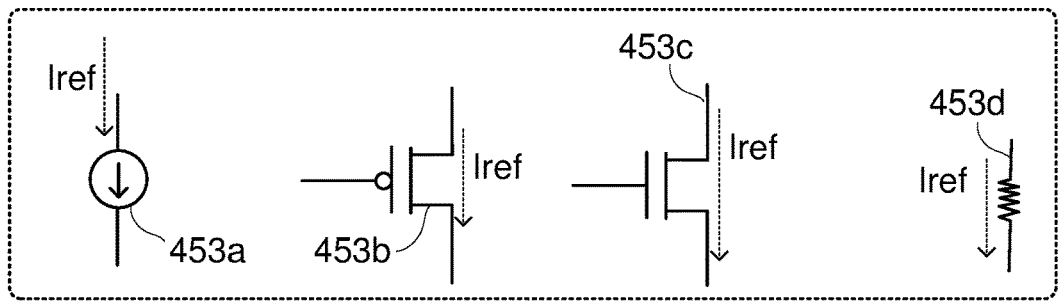
FIG. 6 is a schematic diagram illustrating exemplary implementations of the current sink.

FIG. 6 is a schematic diagram illustrating different exemplary implementations of the current sink. The current sink 453 can be, for example, a current source 453a, a PMOS transistor 453b, an NMOS transistor 453c, a resistor 453d, and so forth.

Figure 2:
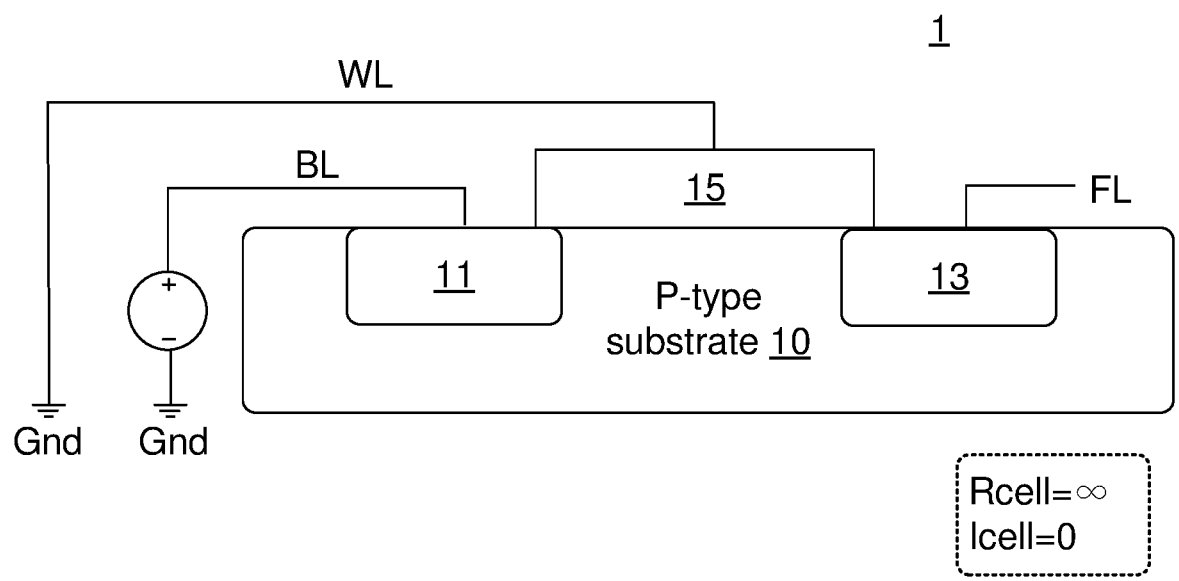
FIG. 2 (prior art) is a cross-section diagram schematically illustrating that an un-programmed memory cell is read based on a conventional approach.
Figure 3A:
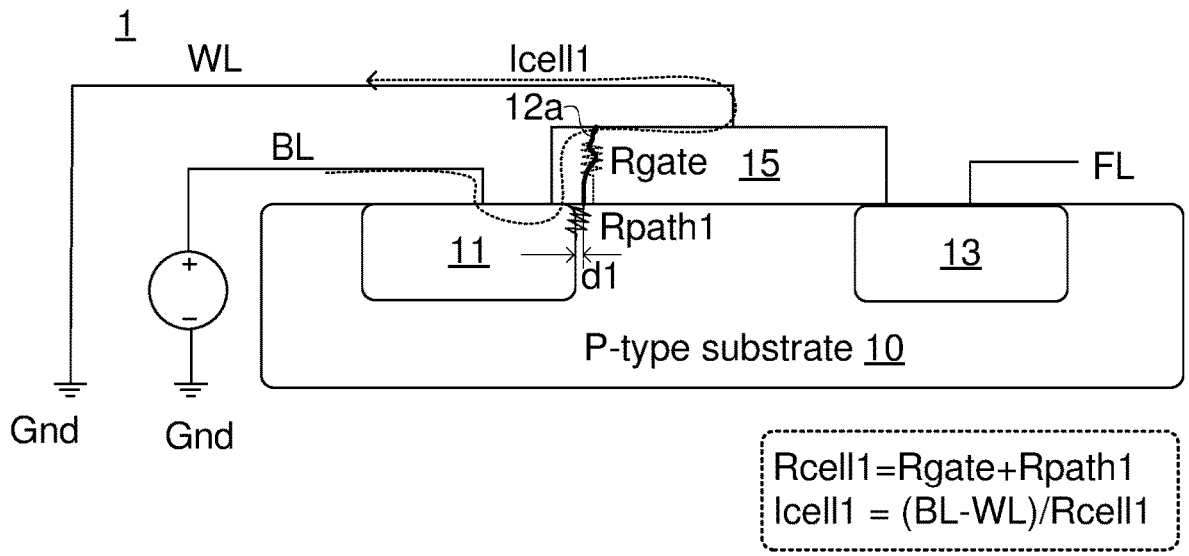
FIG. 3A (prior art) is a cross-section diagram schematically illustrating how the conventional approach senses the programmed NMOS memory cell having a conductive filament nearby the source terminal (S).
Figure 7:
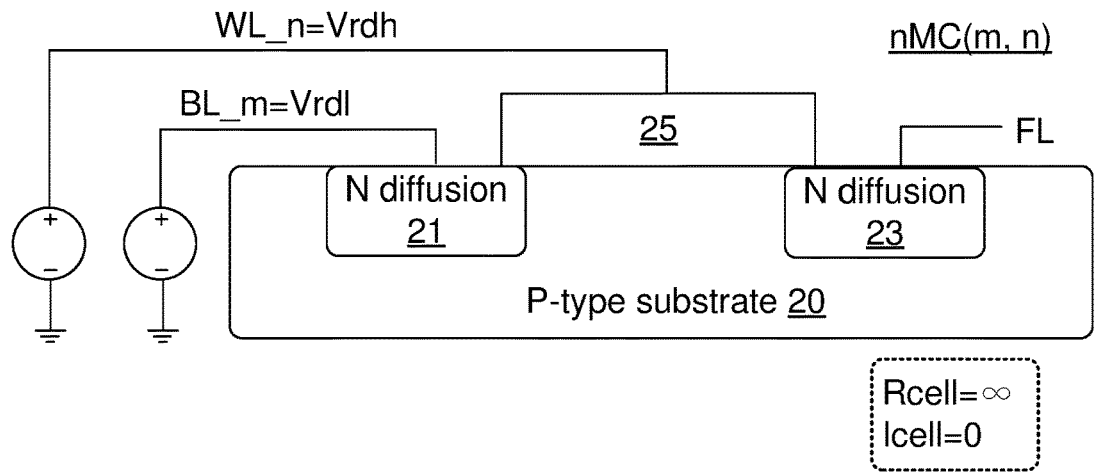
FIG. 7 is a cross-section diagram schematically illustrating that an un-programmed memory cell is read according to the embodiment of the present disclosure.
Figure 8A:
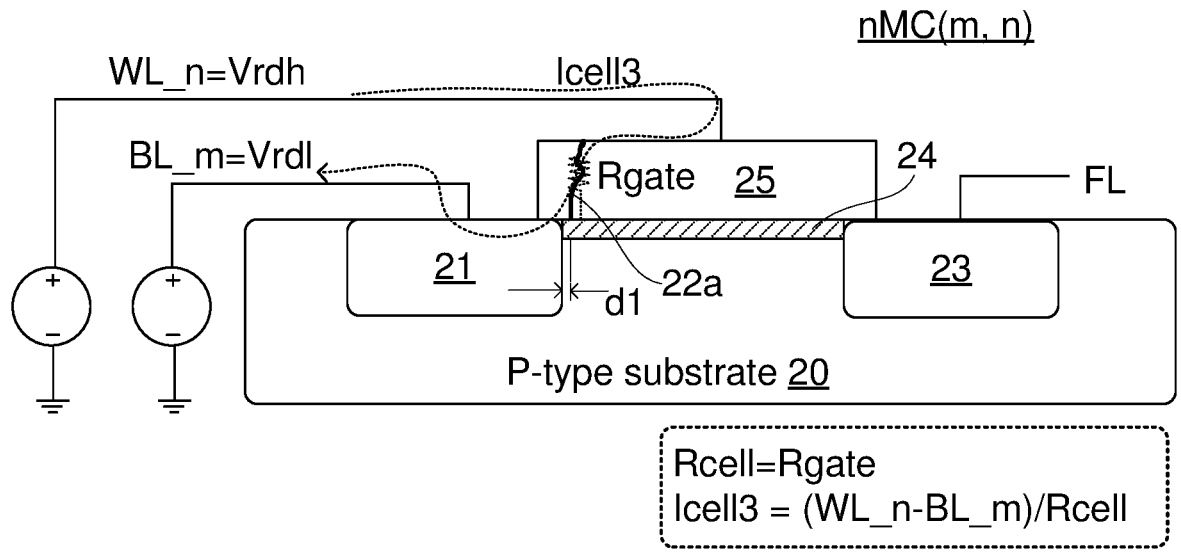
FIG. 8A is a cross-section diagram schematically illustrating how the state of a programmed NMOS memory cell having a conductive filament whose position is relatively close to the source terminal (S) is read according to the embodiment of the present disclosure.
Figure 8B:
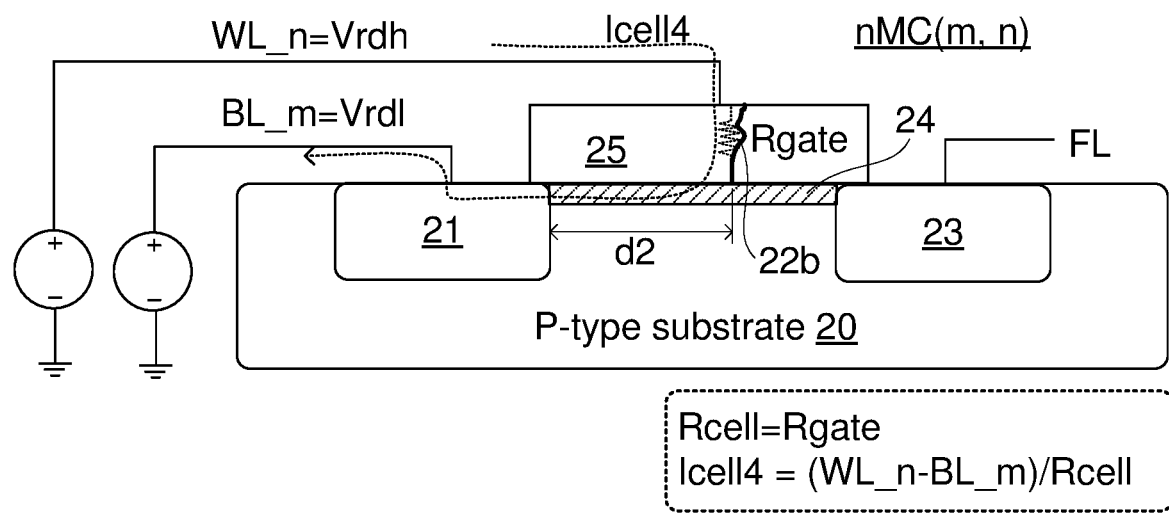
FIG. 8B is a cross-section diagram schematically illustrating how the state of a programmed NMOS memory cell having a conductive filament whose position is relatively far from the source terminal (S) is read according to the embodiment of the present disclosure.

FIGS. 7, 8A, and 8B are cross-section views of an NMOS memory cell nMC(m, n), as being sensed according to the present disclosure. The NMOS memory cell nMC(m, n) has a P-type substrate 20, a source diffusion region 21, a drain diffusion region 23, and a gate oxide 25. FIG. 7 corresponds to the un-programmed memory cell nMC(m, n), and FIGS. 8A and 8B correspond to the programmed memory cells nMC(m, n) having different positions of the conductive filament 22a, 22b. The layout of the P-type substrate 20, the source diffusion region 21, the drain diffusion region 23, and the gate oxide 25 are similar to those in FIGS. 2, 3A, and 3B. Whereas, in FIGS. 8A and 8B, an inversion layer 24 is formed between the source diffusion region 21 and the drain diffusion region 23.

FIG. 7 is a cross-section diagram schematically illustrating that an un-programmed NMOS memory cell nMC(m, n) is read according to the embodiment of the present disclosure. If the NMOS memory cell nMC(m, n) is un-programmed, the word line and the bit line BL_m are disconnected, and no cell current Icell is generated. Thus, the resistance of the cell resistor Rcell can be considered as being infinite (Rcell=∞). Alternatively speaking, FIG. 7 shows that the NMOS memory cell nMC(m, n) can be identified as being un-programmed when the cell current Icell is equivalent to 0 (Icell=0).

In FIGS. 8A and 8B, a cell current Icell flows from the word line WL_m to the bit line BL_n, and the inversion layer (conducting channel) 24 is formed. The existence of the inversion layer 24 implies that no resistor is formed between the bottommost positions of the conductive filament 22a, 22b, and the source diffusion region 21.

FIG. 8A is a cross-section diagram schematically illustrating how the state of a programmed NMOS memory cell nMC(m, n) having a conductive filament whose position is relatively close to the source terminal (S) is read according to the embodiment of the present disclosure. Please refer to FIGS. 3A and 8A together. The positions of the conductive filaments 12a, 22a are identical, but the flow directions of the cell currents Icell1, Icell3 are opposite.

In FIG. 8A, the cell resistor Rcell is equivalent to the gate resistor Rgate, and the cell current Icell3 can be obtained based on the voltage difference (ΔV) between the word line WL_n (with the high read voltage Vrdh) and the bit line BL_m (with the low read voltage Vrdh), together with the cell resistor Rcell. That is, Icell3=(WL_n−BL_m)/Rcell=ΔV/Rcell.

Figure 3B:
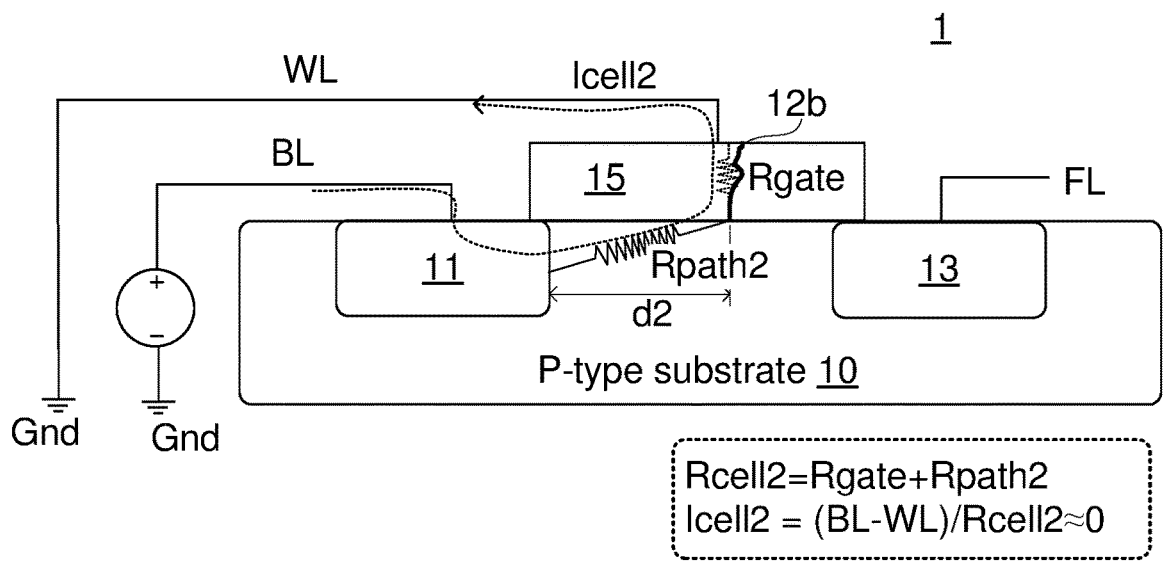
FIG. 3B (prior art) is a cross-section diagram schematically illustrating how the conventional approach senses the programmed NMOS memory cell having a conductive filament far from the source terminal (S).

FIG. 8B is a cross-section diagram schematically illustrating how the state of a programmed NMOS memory cell nMC(m, n) having a conductive filament whose position is relatively far from the source terminal (S) is read according to the embodiment of the present disclosure, Please refer to FIGS. 3B and 8B together. The positions of the conductive filaments 12b, 22b are identical, but the flow directions of the cell currents Icell2, Icell4 are opposite.

In FIG. 8B, the cell resistor Rcell is equivalent to the gate resistor Rgate, and the cell current Icell4 can be obtained based on the voltage difference (ΔV) between the word line WL_n (with the high read voltage Vrdh) and the bit line BL_m (with the low read voltage Vrdh), together with the cell resistor Rcell. That is, Icell4=(WL_n−BL_m)/Rcell=V/Rcell.

FIG. 7 shows that, for the un-programmed NMOS memory cell nMC(m, n), no cell current Icell is generated. On the other hand, FIGS. 8A and 8B represent that, for the programmed NMOS memory cell nMC(m, n), the current value of the cell current Icell3, Icell4 remains consistent, regardless of the position of the conductive filaments 22a, 22b. It can also be concluded that the cell current Icell is higher when the NMOS memory cell nMC(m, n) is programmed (with the conductive state), and the cell current Icell is lower when the NMOS memory cell nMC(m, n) is un-programmed (with the open state).

Figure 9:
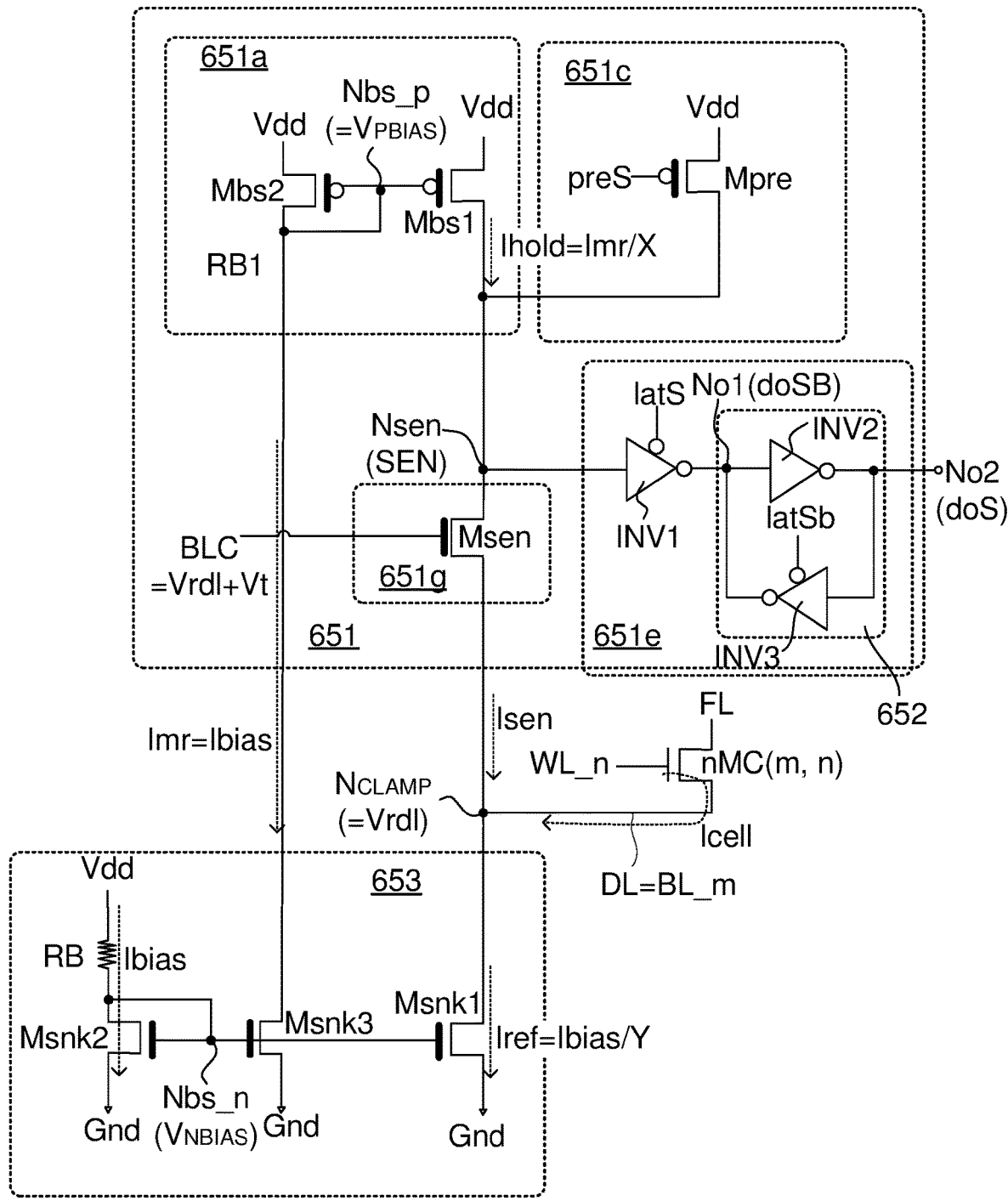
FIG. 9 is a schematic diagram illustrating exemplary implementations of the sensing module.

FIG. 9 is a schematic diagram illustrating exemplary implementations of the sensing module. The sensing module includes a sensing amplifier 651 and a current sink 653. The sensing amplifier 651 and the current sink 653 are both electrically connected to a bias terminal Nbs_p.

The exemplary internal components of the sensing amplifier 651 and their connections are described. The sensing amplifier 651 includes a sensing circuit 651g, a source current mirror 651a, a precharge circuit 651c, and a latch module 651e. The source current mirror 651a, the precharge circuit 651c, the sensing circuit 651g, and the latch module 651e are jointly electrically connected to a sensing terminal Nsen. The signal at the sensing terminal Nsen is defined as a sensing signal SEN. The internal components of the source current mirror 651a, the sensing circuit 651a, the precharge circuit 651c, and the latch module 651e are respectively described below.

The source current mirror 651a includes bias transistors Mbs1, Mbs2. The bias transistors Mbs1, Mbs2 are high voltage PMOS transistors. The source terminals (S) of the bias transistors Mbs1, Mbs2 receive a supply voltage Vdd. The gate terminals (G) of the bias transistors Mbs1, Mbs2, and the drain terminal (D) of the bias transistor Mbs2 are electrically connected to the bias terminal Nbs_p. The signal at the bias terminal Nbs_p is defined as a bias voltage $V_{PBIAS}$ having a constant value. The current flowing through the bias transistor Mbs1 is defined as a holding current Ihold. The current flowing through the bias transistor Mbs2 is defined as a mirrored current Imr. As the bias transistors Mbs1, Mbs2 form a current mirror, and the aspect ratio of the bias transistor Mbs2 is designed to be equivalent to X times of the aspect ratio of the bias transistor Mbs1, the mirrored current Imr is equivalent to X times of the holding current hold (Imr=X*Ihold).

The sensing circuit 651g includes a sensing transistor Msen. The sensing transistor Msen is a high voltage NMOS transistor. The drain terminal (D) of the sensing transistor Msen is electrically connected to the sensing terminal Nsen, the gate terminal (G) of the sensing transistor Msen receives a bias voltage BLC, and the source terminal (S) of the sensing transistor Msen is electrically connected to the clamp terminal $N_{CLAMP}$, through the bit line BL_m. The clamp terminal $N_{CLAMP}$ is clamped at the low read voltage Vrdl. The bias voltage BLC is a constant voltage equivalent to the summation of the low read voltage Vrdl and the threshold voltage Vth of the sensing transistor Msen (BLC=Vrdl+Vt).

The precharge circuit 651c includes a precharge transistor Mpre. The source terminal (S) of the precharge transistor Mpre is electrically connected to a supply voltage terminal Vdd, the gate terminal (G) of the precharge transistor Mpre receives a precharge setting signal preS, and the drain terminal (D) of the precharge transistor Mpre is electrically connected to the sensing terminal Nsen. The precharge setting signal preS is a logic signal used to determine the switching status of the precharge transistor Mpre, and the conduction of the precharge transistor Mpre is related to the signal at the sensing terminal Nsen (sensing signal SEN).

The latch module 651e transforms an analog-type sensing signal SEN to a logic signal doS. Then, the data output signal doS is transmitted to the memory controller. The data output signal doS represents the un-programmed/programmed state of the NMOS memory cell nMC(m, n). The latch module 651e includes inverters INV1, INV2, INV3. The inverters INV1, INV3 are tristate inverters, wherein the inverter INV1 is controlled by a latch signal latS, and the inverter INV3 is controlled by an inverted latch signal latSb. The latch signal latS and the inverted latch signal latSb are logic signals, and they are opposite. Therefore, when the inverter INV1 is enabled by the latch signal latS, the inverter INV3 is disabled by the inverted latch signal latSb, and vice versa.

The inverters INV2, INV3 jointly form a latch circuit 652, and the output of the latch circuit 652 is defined as the data output signal doS. In some applications, the output of the inverter INV1 can be directly utilized by the memory controller 41.

The input of the inverter INV1 is electrically connected to the sensing terminal Nsen, and the output of the inverter INV1 is electrically connected to a first-stage output terminal No1. The signal at the first-stage output terminal Not is defined as an inverted data output signal doSb. The output of the inverter INV2 and the input of the inverter INV3 are electrically connected to a second-stage output signal No2. The signal at the second-stage output terminal No2 is defined as the data output signal doSb.

The internal components of the current sink 653 and their connections are described. The current sink 653 includes sink transistors Msnk1, Msnk2, Msnk3, and a resistor RB. The sink transistors Msnk1, Msnk2, Msnk3 are high voltage NMOS transistors. The gate terminals (G) of the sink transistors Msnk1, Msnk2, Msnk3, and the drain terminal (D) of the sink transistor Msnk2 are jointly electrically connected to a bias terminal Nbs_n. The drain terminal (D) of the sink transistor Msnk is electrically connected to the clamp terminal $N_{CLAMP}$. The source terminals (S) of the sink transistors Msnk1, Msnk2, Msnk3 are electrically connected to the ground terminal Gnd. The signal at the bias terminal Nbs_n is defined as a bias voltage $V_{NBIAS}$ having a constant value.

The sink transistors Msnk1, Msnk2, Msnk3 can be considered as a current mirror. The aspect ratios of the sink transistors Msnk2, Msnk3 are equivalent, and the aspect ratio of the sink transistor Msnk2 is equivalent to Y times of the aspect ratio of the sink transistor Msnk1. The reference current ref flows through the sink transistor Msnk1, and the current flowing through the sink transistor Msnk2 is defined as a bias current Ibias. The drain terminal (D) and the gate terminal (S) of the sink transistor Msnk3 are respectively electrically connected to the bias terminals Nbs_p, Nbs_n. Accordingly, the bias current Ibias is equivalent to Y times of the reference current Iref (Ibias=Y*Iref).

Please note that the sink transistor Msnk3 and the bias transistor Mbs2 belong to the same current path. Thus, the mirrored current Imr flows through the bias transistor Mbs2 and the sink transistor Msnk3. Based on the current mirror formed by the sink transistors Msnk2; Msnk3, the bias current Ibias and the mirrored current Imr are equivalent (Ibias=Imr).

As illustrated above, the bias current bias and the mirrored current Imr are equivalent (Ibias=Imr), the mirrored current Imr is equivalent to X times of the holding current hold (Imr=X*Ihold), and the bias current Ibias is equivalent to Y times of the reference current Iref (Ibias=Y*Iref). Based on these equations of currents (Ibias=Imr, Imr=X*Ihold, Ibias=Y*Iref), a predefined current ratio between the reference current ref and the holding current Ihold can be obtained. That is, Iref/Ihold=X/Y. For the sake of illustration, it is assumed that Y is equivalent to 1 in the following descriptions. However, the values of the variables X and Y are not limited in practical applications.

As illustrated above, the cell current Icell is changed with the state of the NMOS memory cell nMC(m, n). Besides, the reference current Iref, as the summation of the cell current Icell and the sensing current Isen, is constant. Therefore, the sensing current Isen is changed with the un-programmed/programmed state of the NMOS memory cell nMC(m, n) too, except that the change of the sensing current Isen is opposite to the change of the cell current Icell. That is, when the NMOS memory cell nMC(m, n) is un-programmed, the cell current Icell is lower, and the sensing current Isen is higher. On the other hand, when the NMOS memory cell nMC(m, n) is programmed, the cell current Icell is higher, and the sensing current Isen is lower. The feature that the sensing current Isen is changed with the Lin-programmed/programmed state of the NMOS memory cell nMC(m, n) is further utilized in the specification.

Please note that, in practical applications, as long as the sensing current Isen, the cell current Icell, and the reference current ref are satisfied with the condition that the reference current ref is equivalent to the summation of the sensing current Isen and the cell current Icell, that is, Iref=Isen+Icell, and the cell current Icell flows from the word line WL_n to the bit line BL_m, the implementations of the sensing amplifier 651 and the source current mirror 651a are not limited to the embodiments in the specification.

Figures 10, 11:
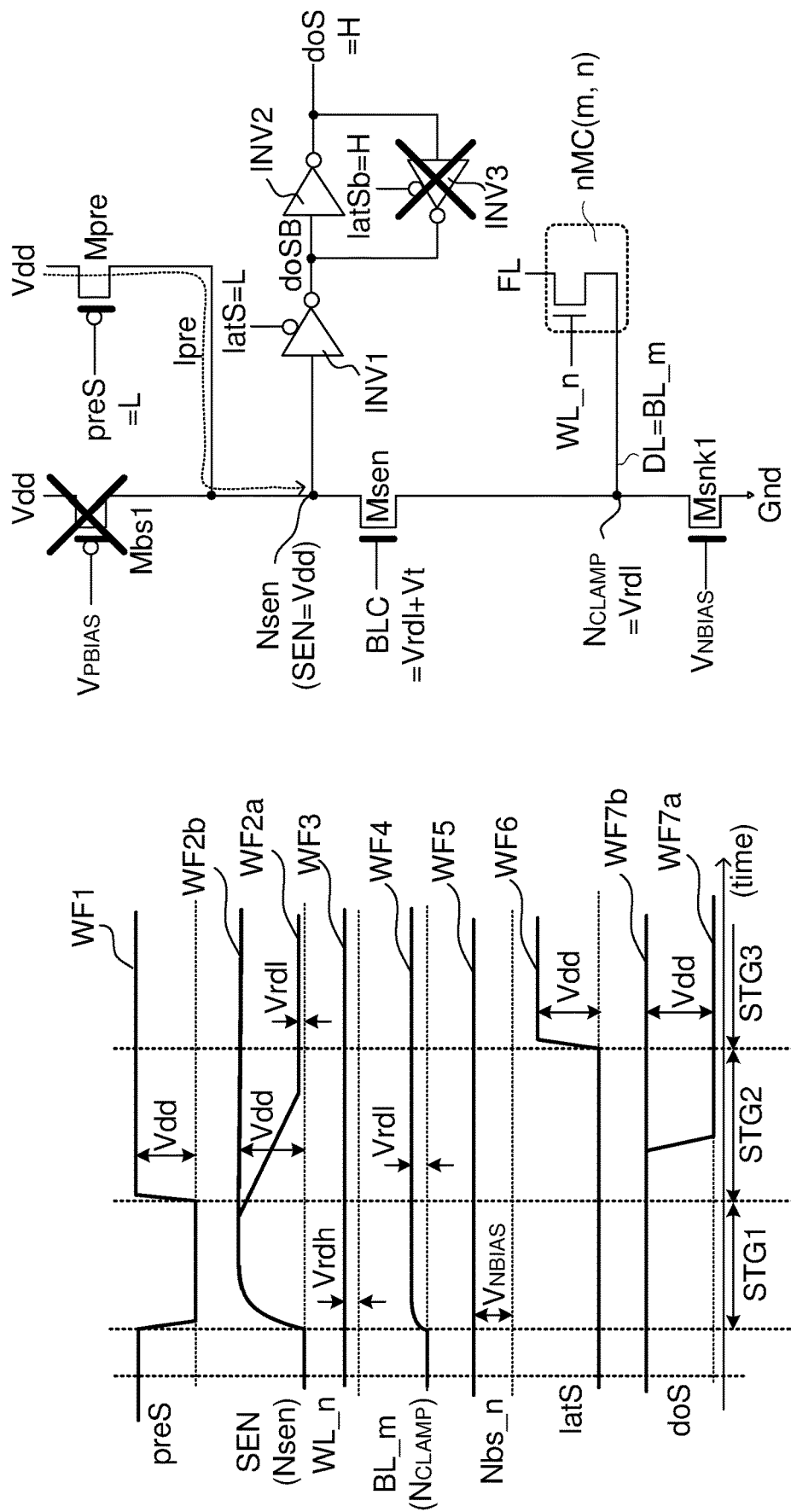
FIG. 10 is a waveform diagram schematically the procedure of reading the programmed state of the NMOS memory cell.
FIG. 11 is a schematic diagram illustrating the precharge stage (STG1) in the reading procedure of the NMOS memory cell.

FIG. 10 is a waveform diagram schematically the procedure of reading the programmed state of the NMOS memory cell nMC(m, n). The vertical axis shows different signals, and the horizontal axis represents time. Please refer to FIGS. 9 and 10 together. From top to down, FIG. 10 includes the precharge setting signal preS (waveform WF1), the sensing signal SEN (waveforms WF2a, WF2b), the n-th word line WL_n (waveform WF3), the m-th bit line BL_m (waveform WF4), the bias signal $V_{NBIAS}$ (waveform WF5), the latch signal latS (waveform WF6), and the data out signal doS (waveforms WF7a, WF7b).

Among these signals, the sensing signal SEN and the data out signal doS are varied with the un-programmed/programmed state of the NMOS memory cell nMC(m, n). For the sensing signal SEN, waveforms WF2a, WF2b respectively correspond to the un-programmed and the programmed NMOS memory cells nMC(m, n). For the data output signal doS, the waveforms WF2b, WF7b respectively correspond to the un-programmed and the programmed NMOS memory cells nMC(m, n).

The reading procedure includes three stages, that is, a precharge stage (STG1) between time points t1 and t2, a development stage (STG2) between time points t2 and t3, and a latch stage (STG3) after time point t3. The precharge stage (STG1) is between time points t1~t2, the development stage (STG2) is between time points t2~t3, and the latch stage (STG3) is after time point t3. The precharge stage (STG1), the development stage (STG2), and the latch stage (STG3) are defined based on changes of the precharge setting signal preS and the latch signal latS, as summarized in Table 3.

TABLE 3

|  | precharge stage (STG1) | development stage (STG2) | latch stage (STG3) |
|---|---|---|---|
| precharge setting signal preS | L | H | H |
| precharge transistor Mpre | ON | OFF | OFF |
| latch signal latS | L | L | H |
| inverter INV1 | enabled | enabled | disabled |
| Inverted latch signal latSb | H | H | L |
| inverter INV3 | disabled | disabled | enabled |

Please refer to FIG. 9 and Table 3 together. The precharge circuit 651c is selectively enabled by the precharge setting signal preS, and the latch module 651e selectively latches the sensing signal SEN to generate the data output signal doS based on the latch signal latS.

In the precharge stage (STG1), the precharge setting signal preS had a low logic level (preS=L) to enable the precharge circuit 651a. In the development stage (STG2) and the latch stage (STG3), the precharge setting signal preS has a high logic level (preS=H) to disable the precharge circuit 651a.

In the precharge stage (STG1) and the development stage (STG2), the inverter INV1 is enabled by the latch signal latS having a low logic level (latS=L=Gnd). In the latch stage (STG3), the inverter INV1 is disabled by the latch signal latS having a high logic level (latS=H=Vdd). In the latch stage (STG3), the sensing signal SEN is latched by the latch module 651, and the data output signal doS is output to the memory controller 41.

FIG. 11 is a schematic diagram illustrating the precharge stage (STG1) in the reading procedure of the NMOS memory cell. Please refer to FIGS. 10 and 11 together.

In the precharge stage (STG1), the precharge setting signal preS and the latch signal latS are set to the low logic level (preS=latS=L=Gnd). Meanwhile, the precharge transistor Mpre is switched on by the precharge setting signal preS, and the precharge transistor Mpre conducts the supply voltage Vdd to the sensing terminal Nsen.

Meanwhile, the bias transistor Mbs1 receives the bias voltage $V_{PBIAS}$ at its gate terminal (G). The bias voltage $V_{PBIAS}$ is slightly lower than the supply voltage Vdd (for example, Vdd=5V and $V_{PBIAS}$=5V). Consequentially, the bias transistor Mbs1 is switched off in the precharge stage (STG1) because voltages at its source terminal (S) and its drain terminal (D) are equivalent (SEN=Vdd).

On the other hand, the precharge setting signal preS is set to the high logic level (preS=H=Vdd) in the development stage (STG2) and the latch stage (STG3). Thus, the precharge transistor Mpre is switched off b the precharge setting signal preS, and the PMOS transistor Mpre is irrelevant to the sensing terminal Nsen in the development stage (STG2) and the latch stage (STG3). Then, the sensing signal SEN is collectively determined by the bias transistor Mbias, the sensing transistor Msen, the NMOS memory cell nMC(m, n), and the sink transistor Msnk.

In the development stage (STG2) and the latch stage (STG3), the bias transistor Mbs1 is turned on by the bias voltage $V_{PBIAS}$, and the holding current hold flows through the bias transistor Mbs1. The reference current ref flowing through the sink transistor Msnk1, the sensing current Isen flowing through the sensing transistor Msen, and the cell current cell flowing through the NMOS memory cell nMC(m, n) remain the relationship Iref=Isen+Icell. The reference current Iref has a constant current value, and the current values of the sensing current Isen and the cell current Icell are varied with the un-programmed/programmed state of the NMOS memory cell nMC(m, n).

The changes of the cell current Icell and the sensing current Isen correspond to the un-programmed/programmed state of the NMOS memory cell nMC(m, n). Moreover, the sensing signal SEN, the inverted data output signal doSB, and the data output signal doS are changed with the sensing current Isen. Thus, the un-programmed/programmed state of the NMOS memory cell nMC(m, n) can be accurately identified by acquiring the state of the data output sign doS.

Figures 12A, 12B:
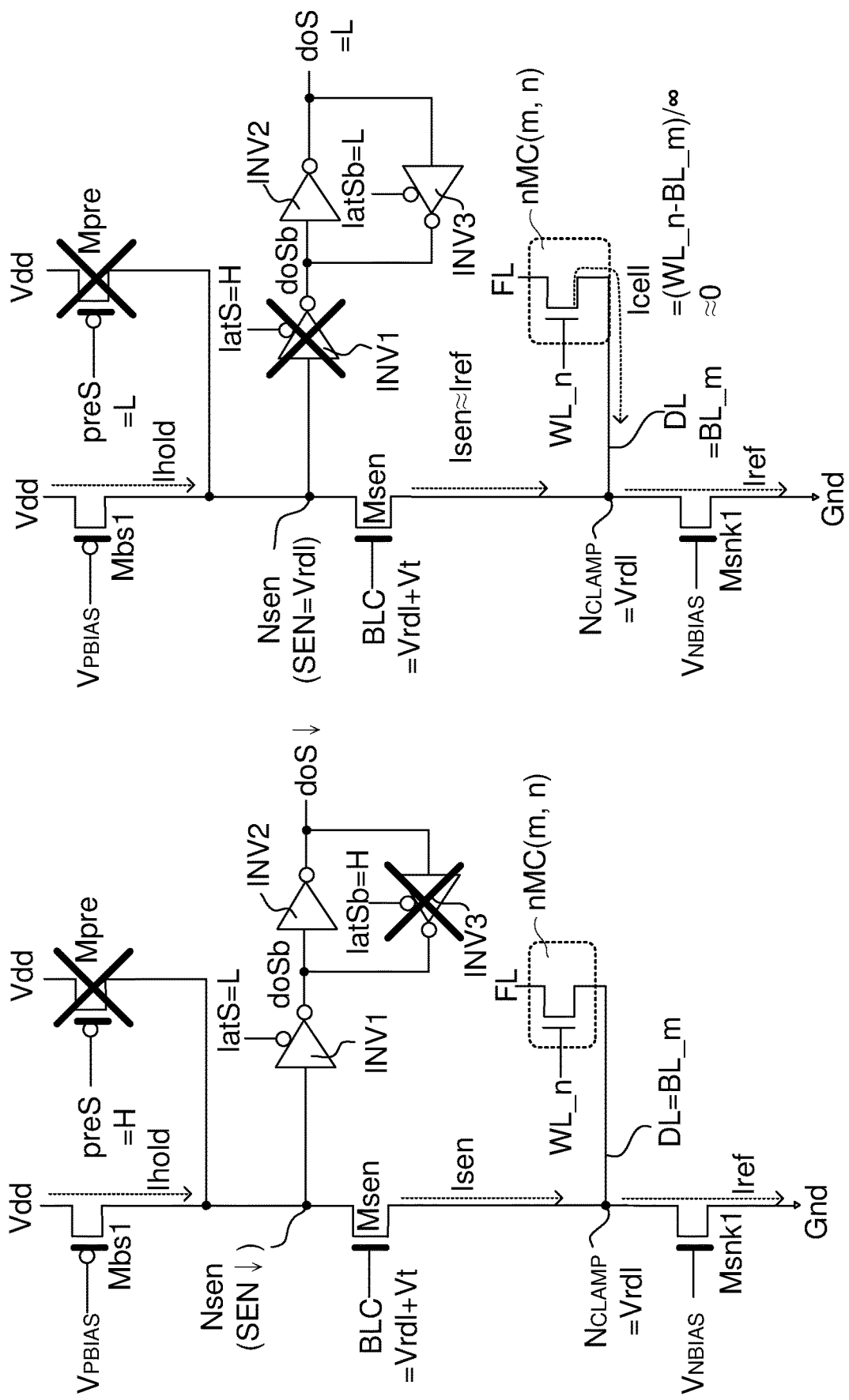
FIG. 12A is a schematic diagram illustrating the development stage (STG2) in the reading procedure of the un-programmed NMOS memory cell.
FIG. 12B is a schematic diagram illustrating the latch stage (STG3) in the reading procedure of the un-programmed NMOS memory cell.

Please note that based on the embodiment of the present disclosure, the state of the data output doS can truly reflect whether the NMOS memory cell nMC(m, n) has been programmed or not, regardless of the difference of the physical position of the conductive filament. FIGS. 12A and 12B correspond to an un-programmed NMOS memory cell (with the open state), and FIGS. 13A and 13B correspond to a programmed NMOS memory cell (with the conductive state).

FIG. 12A is a schematic diagram illustrating the development stage (STG2) the un-programmed NMOS memory cell. Please refer to FIGS. 7 and 12A together. As shown in FIG. 7, the cell current Icell is not generated (Icell=0) when the NMOS memory cell nMC(m, n) is un-programmed. Based on the relationship that Iref=Isen+Icell and Icell=0, we can conclude that the sensing current Isen is equivalent to the reference current ref (Isen=Iref).

Please refer to FIGS. 10 and 12A together. In FIG. 12A, the bias transistor Mbs1 is switched on, and the holding current Ihold flows through the bias transistor Mbs to the sensing terminal Nsen. The holding current Ihold in the development stage (STG2) is much smaller than the precharging current pre in the precharge stage (STG1) because the voltage difference between the source terminal (S) and the gate terminal (G) of the bias transistor Mbs1 in the development stage (STG2) is smaller than that of the precharge transistor Mpre in the precharge stage (STG1).

Furthermore, for sensing the un-programmed NMOS memory cell in the development stage (STG2), the sensing current Isen is equivalent to the reference current Iref. This implies that sensing current Isen is greater than the holding current Ihold, and the sensing signal SEN is dragged down to the low read voltage Vrdl by the sensing current Isen. The waveform WF2a shows that the sensing signal SEN gradually decreases from the supply voltage Vdd in the development stage (STG2).

As the sensing signal SEN decreases in the development stage (STG2), the data output signal doS drops from the high logic level (doS=H=Vdd) to the low logic level (doS=L=Gnd) at the meanwhile.

FIG. 12B is a schematic diagram illustrating the latch stage (STG3) of the un-programmed NMOS memory cell. Please refer to FIGS. 7, 10, 12A, and 12B together. The switching statuses of the precharge transistor Mpre, the bias transistors Mbs1, Mbs2, the sensing transistor Msen, and the sink transistors Msnk1, Msnk2 in FIG. 12B are similar to those in FIG. 12A. The sensing signal SEN remains at the low read voltage Vrdl, through the conduction of the sensing transistor Msen. The inverter INV1 is disabled at the latch stage (STG3), and the inverted data output signal doSb remains its state as time point t3. That is, doSb=H. Then, the inverters INV2, INV3 collectively latch the inverted data output signal doSb and hold the data output signal doS (doS=L).

Figures 13A, 13B:
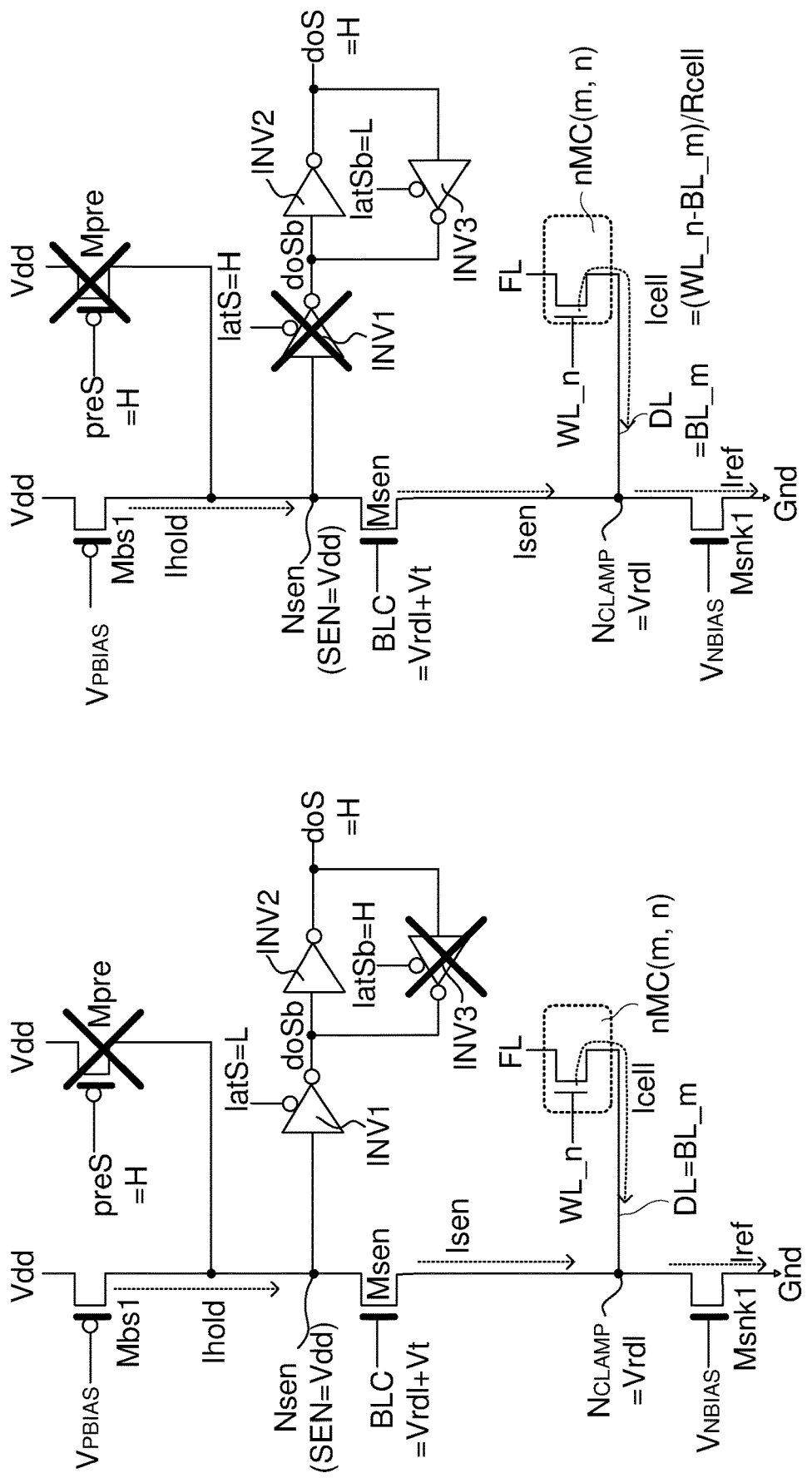
FIG. 13A is a schematic diagram illustrating the development stage (STG2) in the reading procedure of the programmed NMOS memory cell.
FIG. 13B is a schematic diagram illustrating the latch stage (STG3) in the reading procedure of the programmed NMOS memory cell.

FIG. 13A is a schematic diagram illustrating the development stage (STG2) of the programmed NMOS memory cell. Please refer to FIGS. 8A, 8B, and 13A together. As shown in FIGS. 8A and 8B, the cell currents Icell3, Icell4 can be obtained by the gate resistor Rgate and the voltage difference (ΔV) between the word line WL_n (the high read voltage Vrdh) and the bit line BL_m (the low read voltage Vrdl). That is, Icell3=Icell4=(WL_n−BL_m)/Rgate=Vrdh−Vrdl)/Rgate. Together with the relationship that Iref=Isen+Icell, it can be concluded that the sensing current Isen in FIG. 13A is much smaller than that in FIG. 12A.

Please refer to FIGS. 10 and 13A together. In FIG. 13A, the bias transistor Mbs1 is switched on, and the holding current hold flows through the bias transistor Mbs to the sensing terminal Nsen. Compared with the precharging current Ipre in the precharge stage (STG1), the holding current Ihold in the development stage (STG2) is much smaller because the voltage difference between the source terminal (S) and the gate terminal (G) of the bias transistor Mbs1 in the development stage (STG2) is smaller than that of the precharge transistor Mpre in the precharge stage (STG1).

As illustrated above, the sensing current Isen in FIG. 13A is smaller. Therefore, the holding current Ihold can maintain the sensing signal SEN at the supply voltage Vdd. The waveform WF2*b* shows that the sensing signal SEN remains at the supply voltage Vdd in the development stage (STG2). As the sensing signal SEN remains at the supply voltage Vdd in the development stage (STG2), the data output signal doS remains at the high logic level (doS=H=Vdd) at meanwhile, as the waveform WF7*b* shows.

FIG. 13B is a schematic diagram illustrating the latch stage (STG3) of the programmed NMOS memory cell. Please refer to FIGS. 8A, 8B, 10, 13A, and 13B together. The switching statuses of the precharge transistor Mpre, the bias transistors Mbs1, Mbs2, the sensing transistor Msen, and the sink transistors Msnk1, Msnk2 in FIG. 13B are similar to those in FIG. 13A. The sensing signal SEN remains at the supply voltage Vdd, through the conduction of the bias transistor Mbs1 The inverter INV1 is disabled at the latch stage (STG3), and the inverted data output signal doSb remains its state as time point t3. That is, doSb=L. Then, the inverters INV2, INV3 collectively latch the inverted data output doSb and hold the data output signal doS (doS=H).

Please refer to FIGS. 12B and 13B together. At the sensing terminal Nsen, the sensing signal SEN is jointly determined by the holding current Ihold and the sensing current Isen. In FIG. 12B, the sensing current Isen is greater when the NMOS memory cell nMC(m, n) is un-programmed. This further results in that the sensing current Isen is greater than the holding current Ihold (Isen>Ihold). Consequently, the sensing current Isen pulls the sensing signal SEN down to the low read voltage Vrdl, via the conduction of the sensing transistor Msen. In FIG. 13B the sensing current Isen is lower when the NMOS memory cell nMC(m, n) is programmed. This implies that the sensing current Isen is lower than the holding current Ihold (Isen<Ihold). Consequently, the holding current Ihold pulls the sensing signal SEN up to the supply voltage Vdd, via the conduction of the bias transistor Mbs1.

When the NMOS memory cell nMC(m, n) is un-programmed (see FIG. 12B) the cell current Icell is close to zero, and the sensing current Isen is higher than the holding current Ihold (Isen>Ihold), which means that the sensing current Isen drags the sensing signal SEN to the low read voltage Vrdl (SEN=Vrdl). When the NMOS memory cell nMC(m, n) is programmed (see FIG. 13B), the cell current Icell is generated, and the sensing current Isen is lower than the holding current Ihold (Isen<Ihold), which means that the holding current Ihold pulls the sensing signal SEN up to the supply voltage Vdd (SEN=Vdd).

When the holding current hold and the sensing current Isen are equivalent (Ihold=Isen), the sensing signal SEN is equivalent to a threshold sensing voltage Vth_sen=0.5*Vdd. Moreover, based on the current relationships that Ibias=X*Ihold, Iref=Isen+Icell, and Ibias=Iref, the current value of the cell current Icell corresponding to the threshold sensing voltage Vth_sen can be conducted as $$Icell = \frac{(X-1)}{X} * Iref.$$

Accordingly, the threshold sensing voltage Vth_sen can be referred to identify the un-programmed/programmed state of the NMOS memory cell nMC(m, n). Table 4 summarizes how the un-programmed/programmed state of the NMOS memory cell nMC(m, n) affects the current values.

TABLE 4

| | un-programmed NMOS memory cell nMC(m, n) | programmed NMOS memory cell nMC(m, n) |
|---|---|---|
| | (FIG. 7) | FIG. 8A FIG. 8B |
| state of the equivalent circuit | open state | conductive state |
| cell resistance Rcell | Rcell=∞ | Rcell=Rgate |
| cell current | Icell=(WL_n−BL_m)/∞=0 | Icell=(WL_n−BL_m)/Rgate |
| | Icell=(BL_n−WL_n)/Rcell | $Icell < \frac{(X-1)}{X} * Iref$ | $Icell > \frac{(X-1)}{X} * Iref$ |
| sensing current Isen | Isen is greater | Isen is lower |
| reference current Iref | Iref is constant, and Iref=1/Y*Ibias (assuming Y=1) | |
| relationship between Isen and Ihold | Ihold<Isen | Ihold>Isen |
| sensing signal SEN (based on Ihold and Isen) | SEN=Vrdl (<Vth_sen) | SEN=Vdd (>Vth_sen) |
| data out signal doS | doS=Gnd (FIGS. 12A, 12B) | doS=Vdd (FIGS. 13A, 13B) |

Figure 14:
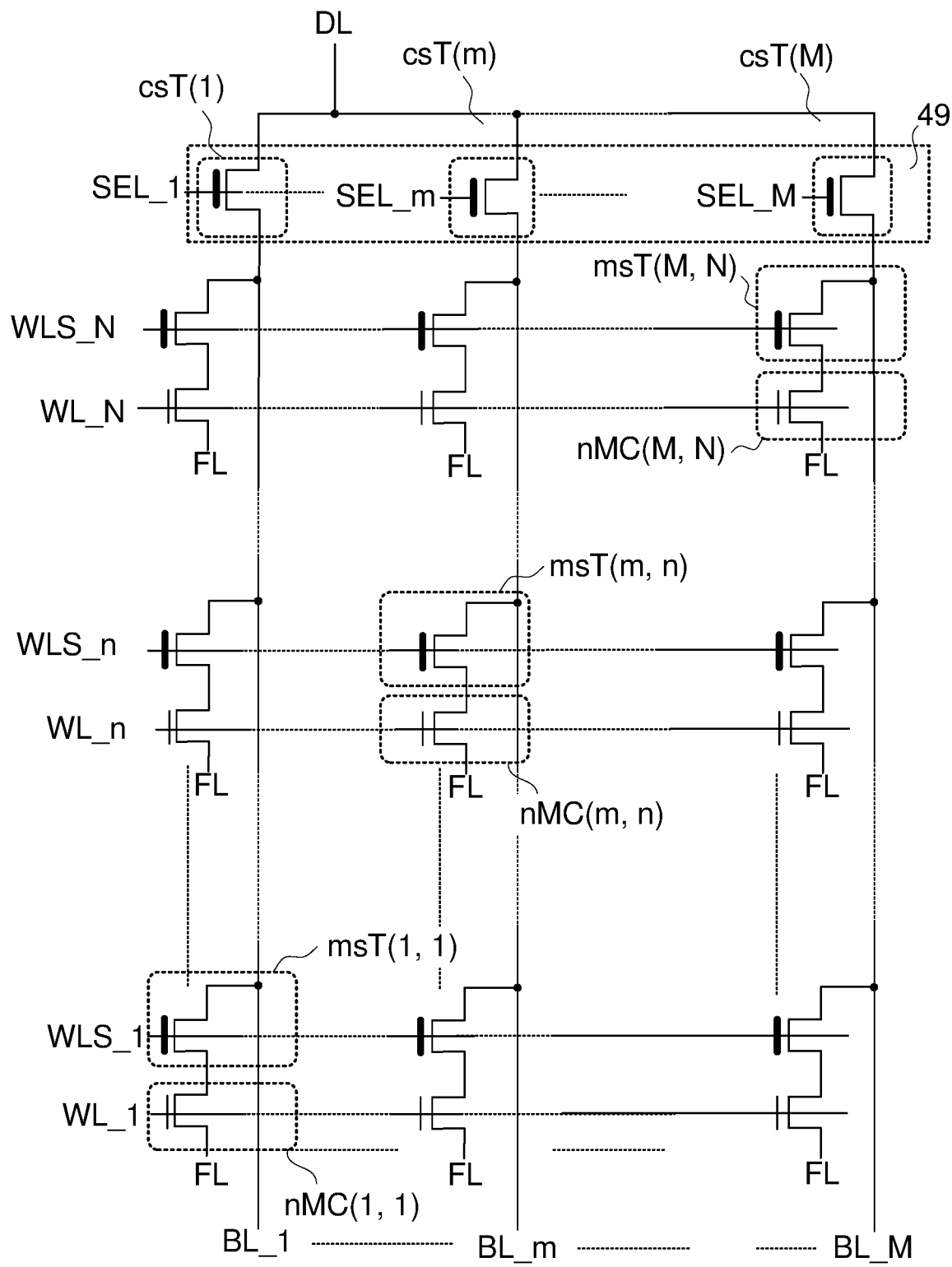
FIG. 14 is a schematic diagram illustrating the memory array having NMOS memory cells incorporating selection transistors.

The above-illustrated read approach can be applied to the memory arrays with design modifications as well. FIG. 14 is a schematic diagram illustrating that the memory array further includes memory selection transistors msT(1, 1)~msT(M, N). The bit line decoder 49 includes column selection transistors csT(1)~csT(M). In addition to the NMOS memory cells nMC(1, 1)~nMC(M, N), the memory circuit further includes M*N memory selection transistors.

In FIG. 14, each memory selection transistor msT(1, 1)·msT(N) corresponds to an NMOS memory cell nMC(1, 1)~nMC(M, N). For example, the memory selection transistor msT(m, n) corresponds to the NMOS memory cell nMC(m, n). The combination of the memory selection transistor msT(m, n) and the NMOS memory cell nMC(m, n) can be defined as a memory unit MU(m, n).

The memory selection transistors msT(1, 1)~mST(M, N) located at the same row are controlled by the same word selection line WLS_1~WLS_N. Details about the use and control of the memory selection transistors msT(1, 1)~msT(M, N) are omitted.

Figure 15:
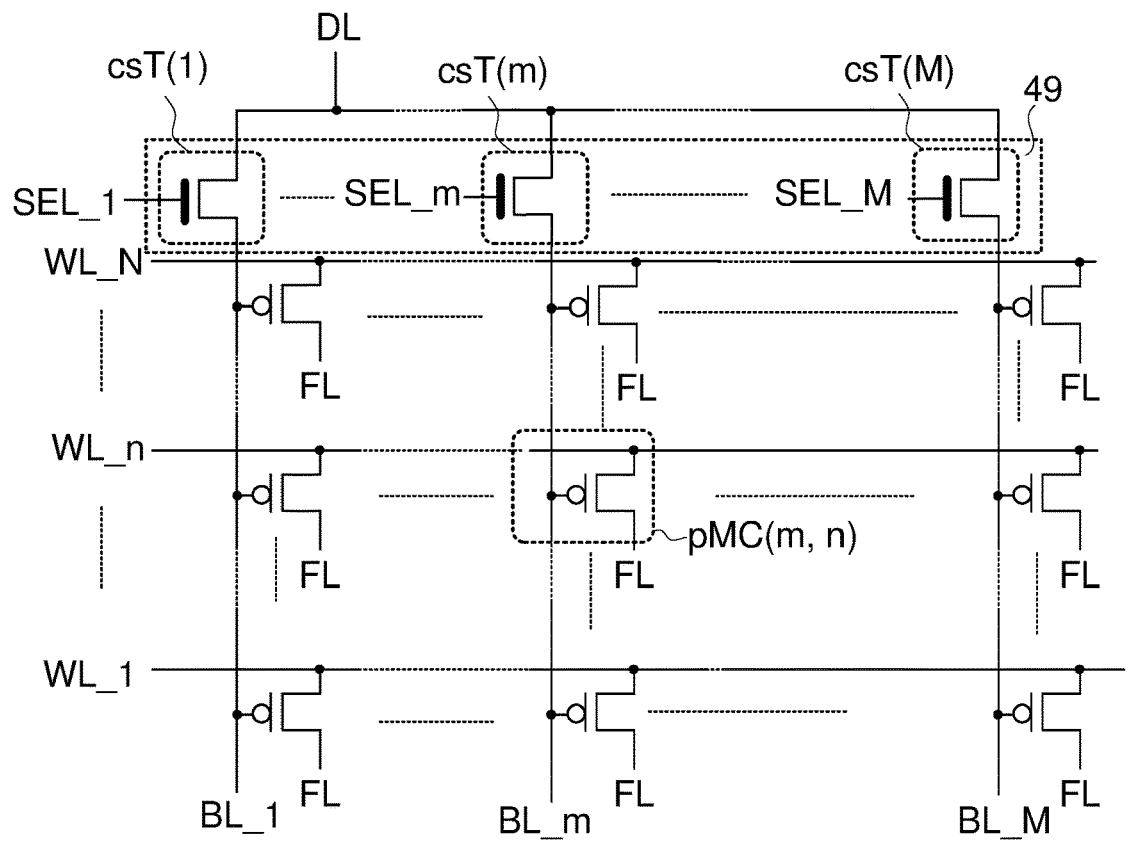
FIG. 15 is a schematic diagram illustrating the memory array having PMOS memory cells.

FIG. 15 is a schematic diagram illustrating the memory array having PMOS memory cells. In some cases, the memory circuit 47 might include a PMOS memory array. Similarly, the PMOS memory cells pMC(1, 1)~pMC(M, N) are arranged in M columns and N rows. The source terminal (S) of the memory cell MC(m, n) is electrically connected to the nth word line WL_n, the gate terminal (G) of the memory cell MC(m, n) is electrically connected to the m-th bit line BL_m, and the drain terminal (D) of the memory cell MC(m, n) is floating FL.

The memory circuit 47 may further include column selection transistors csT(1)~csT(M). The connections between the PMOS memory cells pMC(1, 1)~pMC(M N), the column selection transistors csT(1)~csT(M), data line DL, the bit lines BL_1~BL_M, and the word lines WL_1~WL_N are not described to avoid redundancy.

Figure 16:
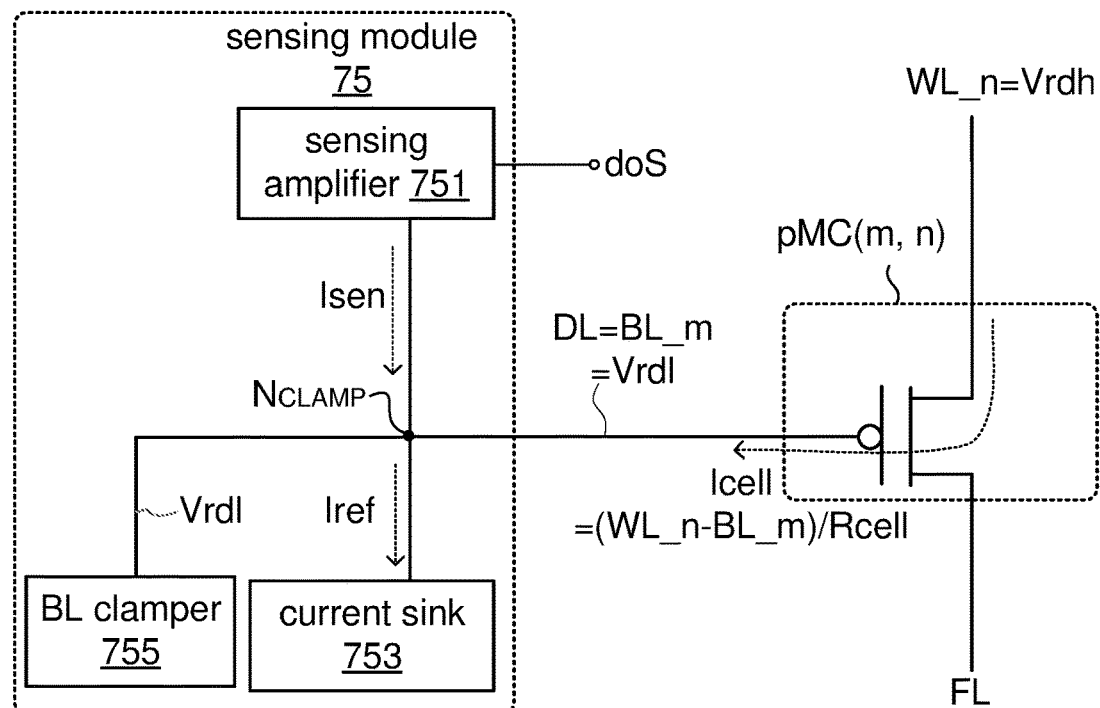
FIG. 16 is a schematic diagram illustrating a read operation performed to an NMOS memory cell pMC(m, n) according to an embodiment of the present disclosure.

FIG. 16 is a schematic diagram illustrating a read operation performed to an NMOS memory cell pMC(m, n) according to an embodiment of the present disclosure. Please refer to FIGS. 5 and 15 together. Basically, the design of the sensing modules 45, 75 are similar, except that the connections between the sensing module and the PMOS memory cell pMC(m, n) are modified.

In FIG. 16, a cell current Icell flows from the source terminal (S) of the PMOS memory cell pMC(m, n) to the gate terminal (G) of the PMOS memory cell pMC(m, n). A sensing current Isen originating from the sensing amplifier 751 flows to the current sink 753. The summation of the sensing current Isen and the cell current cell is equivalent to the reference current Iref. The reference current Iref is constant, and the reference current Iref flows to the current sink 753. Based on the sensing current Isen, the sensing amplifier 751 generates a data output signal doS, and the data output signal doS is further transmitted to the memory controller 41.

According to the embodiment of the present disclosure, an inversion layer is formed between the source terminal (S) and the drain terminal (D) of the PMOS memory cell pMC(m, n) during the read operation, and the cell resistor Rcell is equivalent to the gate resistor Rgate (Rcell=Rgate) because the PMOS transistor is switched on.

Figure 17:
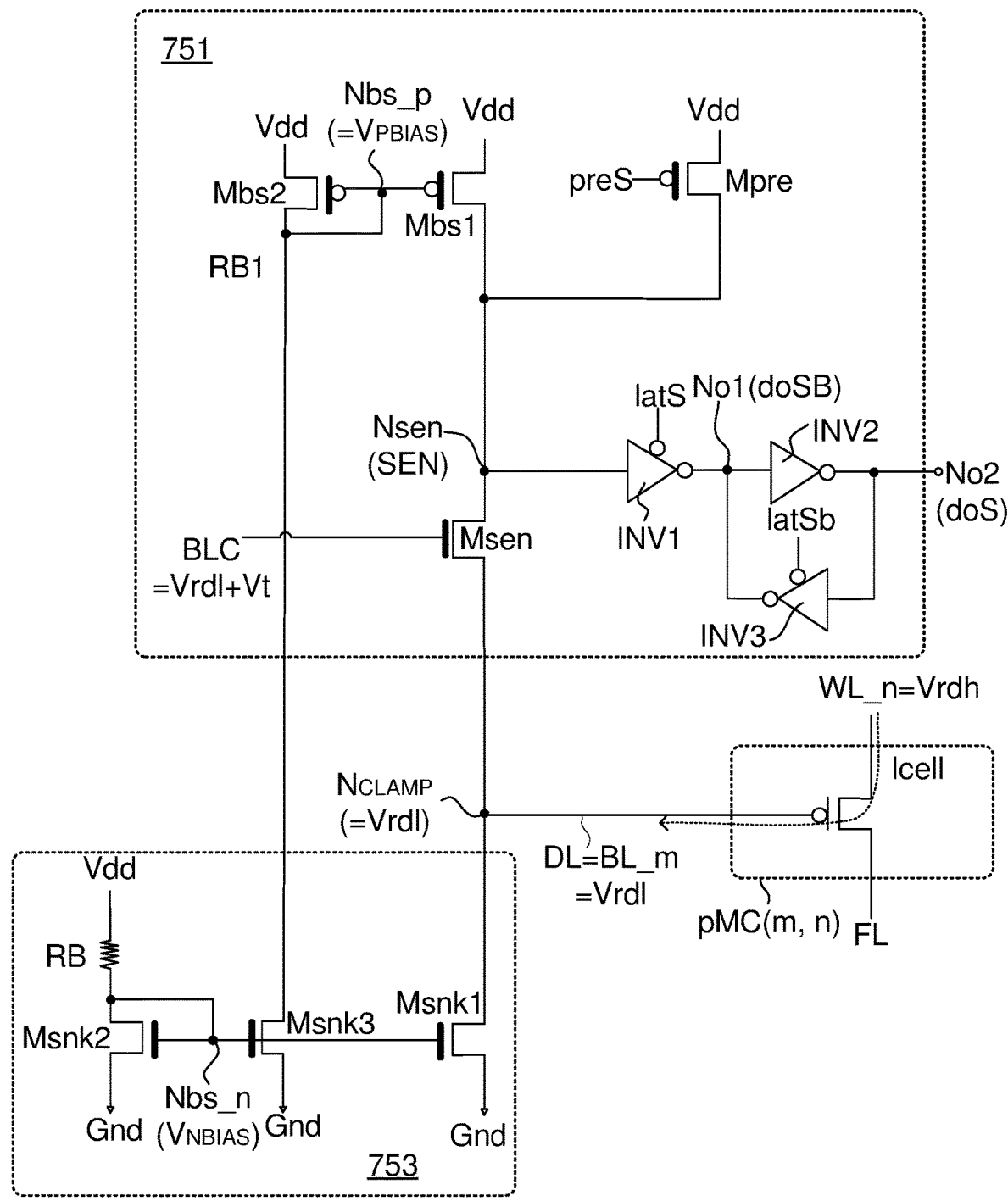
FIG. 17 is a schematic diagram illustrating the sensing module for sensing the un-programmed/programmed state of the PMOS memory cell pMC(m, n).

FIG. 17 is a schematic diagram illustrating the sensing module for sensing the un-programmed/programmed state of the PMOS memory cell pMC(m, n). The designs of the sensing amplifier 751 and the current sink 753 are similar to those in FIG. 9.

In FIG. 17, the source terminal (S) of the PMOS memory cell pMC(m, n) is electrically connected to the word line WL_n, the gate terminal (G) of the PMOS memory cell pMC(m, n) is electrically connected to the bit line BL_m, and the drain terminal (D) of the PMOS memory cell pMC(m, n) is floating FL.

When the PMOS memory cell pMC(m, n) is un-programmed, no cell current Icell is generated during the read operation. Therefore, the cell current Icell is equivalent to 0 (Icell=0), and the reference current Iref and the sensing current Isen are equivalent (Iref=Isen). Under such circumstances, the operations of the sensing amplifier 751 and the current sink 753 are similar to those described in FIGS. 12A and 12B.

When the PMOS memory cell pMC(m, n) is programmed, the cell current Icell flows from the source terminal (S) to the gate terminal (G), and the sensing current Isen dramatically decreases. Under such circumstances, the operations of the sensing amplifier 751 and the current sink 753 are similar to those described in FIGS. 13A and 13B.

As illustrated above, the sensing operations applied to the NMOS memory cell and the PMOS memory cell are similar. Therefore, details about how the PMOS memory cell pMC(m, n) can be conducted similarly based on the descriptions related to the NMOS memory cell nMC(m, n), and the illustrations are omitted.

To summarize, the cell current Icell, according to the embodiments of the present disclosure, can truly reflect the un-programmed/programmed state of the memory cell. Moreover, the change of the current Icell and the change of the sensing current Isen are opposite. The change of the sensing current Isen further implies that the comparison result between the sensing current Isen and the holding current Ihold is varied with the un-programmed/programmed state of the memory cell. Consequentially, the sensing signal SEN can represent the un-programmed/programmed state of the memory cell because the sensing signal SEN is altered by the sensing current Isen and the holding current Ihold.

The embodiments above demonstrate that the sensing result is related to the un-programmed/programmed state of the memory cells. The position variance of the conductive filament does not change the sensing result, and the un-programmed/programmed state of the memory cell can be correctly identified. The embodiments focus on the OTP memory cells, but a similar approach can be slightly modified to suit other types of non-volatile memories, based on the concept of the present disclosure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A sensing module, configured to perform a read operation to a memory cell, comprising:
   a sensing amplifier, electrically connected to the memory cell at a clamp terminal, configured to generate a sensing current and identify a state of the memory cell based on the sensing current, wherein the clamp terminal is clamped at a low read voltage during the read operation; and
   a current sink, electrically connected to the clamp terminal, configured to receive a reference current being equivalent to a summation of the sensing current and a cell current flowing through the memory cell, wherein both the sensing current and the cell current flow to the current sink via the clamp terminal, the reference current is constant, and the sensing current is changed with the cell current,
wherein the cell current is generated based on a high read voltage and the low read voltage being applied to the memory cell, wherein
the sensing current is higher if the memory cell is un-programmed, and
the sensing current is lower if the memory cell is programmed.

2. The sensing module according to claim 1, wherein during the read operation,
the cell current is not generated if the memory cell is un-programmed; and
the cell current is generated if the memory cell is programmed.

3. The sensing module according to claim 2, wherein the memory cell is a transistor having a source terminal, a gate terminal, and a drain terminal, wherein
the high read voltage is applied to one of the source terminal and the gate terminal, and
the low read voltage is applied to the other of the source terminal and the gate terminal.

4. The sensing module according to claim 1, wherein if the memory cell is programmed,
a gate oxide of the memory cell has a conductive filament, and the conductive filament corresponds to a gate resistance value.

5. The sensing module according to claim 4, wherein the cell current is determined by the gate resistance value and a voltage difference between the high read voltage and the low read voltage.

6. The sensing module according to claim 1, wherein if the memory cell is programmed,
an inversion layer is formed between a source terminal and a drain terminal of the memory cell during the read operation.

7. The sensing module according to claim 1, wherein the memory cell is electrically connected to a word line and a bit line, and the cell current sequentially flows through the word line, the memory cell, and the bit line.

8. The sensing module according to claim 1, wherein the memory cell is an NMOS transistor, wherein during the read operation,
a source terminal of the NMOS transistor receives the low read voltage through a bit line,
a gate terminal of the NMOS transistor receives the high read voltage through a word line, and
a drain terminal of the NMOS transistor is floating, wherein the cell current flows from the gate terminal of the NMOS transistor to the source terminal of the NMOS transistor.

9. The sensing module according to claim 1, wherein the memory cell is a PMOS transistor, wherein during the read operation,
a source terminal of the PMOS transistor receives the high read voltage through a word line,
a gate terminal of the PMOS transistor receives the low read voltage through a bit line, and
a drain terminal of the PMOS transistor is floating, wherein the cell current flows from the source terminal of the PMOS transistor to the gate terminal of the PMOS transistor.

10. The sensing module according to claim 1, wherein the current sink is a current source, a PMOS transistor, an NMOS transistor, or a resistor.

11. The sensing module according to claim 1, wherein the read operation comprises a first stage, a second stage, and a third stage, wherein the second stage is after the first stage, the third stage is after the second stage, and the sensing amplifier comprises:
a current source, electrically connected to a sensing terminal, configured to selectively conduct a holding current to the sensing terminal during the read operation, wherein the holding current is constant;
a pre-charge circuit, electrically connected to the sensing terminal, configured to selectively conduct a precharging current to the sensing terminal during the read operation, wherein the holding current and the pre-charging current are alternatively generated; and
a latch module, electrically connected to the sensing terminal, configured to selectively output a data output signal in the third stage based on the sensing signal.

12. The sensing module according to claim 11, wherein
the holding current is lower than the sensing current if the memory cell is un-programmed, and
the holding current is higher than the sensing current if the memory cell is programmed.

13. The sensing module according to claim 12, wherein the sensing amplifier further comprises:
a sensing circuit, electrically connected to the current source, the pre-charge circuit, and the sensing terminal, configured to conduct the sensing current from the sensing terminal to the current sink.

14. The sensing module according to claim 11, wherein a signal at the sensing terminal is changed with the sensing current, wherein
the signal at the sensing terminal is lower if the sensing current is higher, and
the signal at the sensing terminal is higher if the sensing current is lower.

15. The sensing module according to claim 11, wherein
the current source stops conducting the holding current to the sensing terminal in the first stage, and
the current source conducts the holding current to the sensing terminal in the second stage and the third stage.

16. The sensing module according to claim 11, wherein the reference current and the holding current has a pre-defined current ratio.

17. The sensing module according to claim 11, wherein
the pre-charge circuit conducts the precharging current in the first stage, and
the pre-charge circuit stops conducting the precharging current in the second stage and the third stage.

18. The sensing module according to claim 1, wherein the high read voltage and the low read voltage are greater than a ground voltage, and the high read voltage is greater than the low read voltage.

19. A memory device, comprising:
a memory circuit, comprising:
M bit lines, arranged in parallel with a first direction;
N word lines, arranged in parallel with a second direction; and
M*N memory units, wherein a selected memory unit among the M*N memory units is electrically connected to an m-th bit line among the M bit lines and an n-th word line among the N word lines; and
a sensing module, electrically connected to the M bit lines, configured to perform a read operation to the selected memory unit, comprising:
a sensing amplifier, electrically connected to the selected memory unit at a clamp terminal, configured to generate a sensing current and identify a state of the memory cell based on the sensing current, wherein the clamp terminal is clamped at a low read voltage during the read operation; and a current sink, electrically connected to the clamp terminal, configured to receive a reference current being equivalent to a summation of the sensing current and a cell current flowing through a memory cell in the selected memory unit, wherein both the sensing current and the cell current flow to the current sink via the clamp terminal, the reference current is constant, and the sensing current is changed with the cell current, wherein the cell current is generated based on a high read voltage and the low read voltage being applied to the memory cell, wherein the sensing current is higher if the memory cell is un-programmed, and the sensing current is lower if the memory cell is programmed.

20. A sensing method applied to a sensing module being configured to read a state of a memory cell, wherein the sensing method comprises steps of:

applying a high read voltage and a low read voltage to the memory cell so that a cell current flowing through the memory cell and a clamp terminal is generated, wherein the clamp terminal is clamped at the low read voltage when a state of the memory cell is being read;

generating a sensing current, wherein the sensing current is higher if the memory cell is un-programmed, and the sensing current is lower if the memory cell is programmed;

a current sink receiving a reference current being equivalent to a summation of the sensing current and the cell current, wherein both the sensing current and the cell current flow to the current sink via the clamp terminal, the reference current is constant, and the sensing current is changed with the cell current; and identifying the state of the memory cell based on the sensing current.

* * * * *